United States Patent
Itaya

(10) Patent No.: US 10,348,128 B2
(45) Date of Patent: Jul. 9, 2019

(54) VOLTAGE CONTROL DEVICE AND VOLTAGE MEASUREMENT DEVICE

(71) Applicant: Mitsubishi Electric Corporation, Chiyoda-ku, Tokyo (JP)

(72) Inventor: Nobuhiko Itaya, Tokyo (JP)

(73) Assignee: MITSUBISHI ELECTRIC CORPORATION, Chiyoda-Ku, Tokyo (JP)

(*) Notice: Subject to any disclaimer, the term of this patent is extended or adjusted under 35 U.S.C. 154(b) by 49 days.

(21) Appl. No.: 15/572,917

(22) PCT Filed: May 27, 2015

(86) PCT No.: PCT/JP2015/065314
§ 371 (c)(1),
(2) Date: Nov. 9, 2017

(87) PCT Pub. No.: WO2016/189715
PCT Pub. Date: Dec. 1, 2016

(65) Prior Publication Data
US 2018/0123388 A1     May 3, 2018

(51) Int. Cl.
*G06F 19/00* (2018.01)
*H02J 13/00* (2006.01)
(Continued)

(52) U.S. Cl.
CPC .......... *H02J 13/0017* (2013.01); *B60M 3/06* (2013.01); *H02J 3/12* (2013.01); *H02J 3/381* (2013.01);
(Continued)

(58) Field of Classification Search
CPC .. B60M 3/06; G01R 19/16528; G01R 21/133; H02J 13/0017; H02J 3/12;
(Continued)

(56) References Cited

U.S. PATENT DOCUMENTS

| 5,196,781 A * | 3/1993 | Jamieson ............... H02J 7/35 136/291 |
| 2002/0084767 A1* | 7/2002 | Arai .................. H02J 7/35 320/101 |

(Continued)

FOREIGN PATENT DOCUMENTS

| JP | 2005-160260 A | 6/2005 |
| JP | 2006-325380 A | 11/2006 |

(Continued)

OTHER PUBLICATIONS

Notification of Reasons for Refusal for Japanese Patent Application No. 2015-553685, dated Dec. 4, 2015.
(Continued)

*Primary Examiner* — Kidest Bahta
(74) *Attorney, Agent, or Firm* — Buchanan Ingersoll & Rooney PC

(57) ABSTRACT

A voltage control device includes a fluctuation calculating unit that calculates voltage tolerance, which is a difference between a voltage measured by a voltage control apparatus and a proper voltage upper limit value or a proper voltage lower limit value, and voltage sensitivity, which is a ratio of a fluctuation amount of active power and a fluctuation amount of the voltage, a change-request-information generating unit that generates information for requesting a change of a limit value of a control target range of other voltage control devices, a change processing unit that performs a change of a limit value of a control target range of the voltage control device according to content of the change request information, and a communication processing unit that transmits the change request information to the voltage control devices other than the voltage control device. The change request information includes information indicating voltage tolerance and voltage sensitivity.

7 Claims, 10 Drawing Sheets

(51) Int. Cl.
  *H02J 3/12* (2006.01)
  *B60M 3/06* (2006.01)
  *H02J 3/38* (2006.01)
  *G01R 19/165* (2006.01)
  *G01R 21/133* (2006.01)
  *H02J 7/35* (2006.01)

(52) U.S. Cl.
  CPC ........ *H02J 3/383* (2013.01); *G01R 19/16528* (2013.01); *G01R 21/133* (2013.01); *H02J 7/35* (2013.01); *Y02E 40/72* (2013.01); *Y04S 10/12* (2013.01); *Y04S 10/123* (2013.01)

(58) Field of Classification Search
  CPC .. H02J 3/383; H02J 7/35; Y02E 40/72; Y04S 10/12; Y04S 10/123
  See application file for complete search history.

(56) References Cited

U.S. PATENT DOCUMENTS

| | | | | |
|---|---|---|---|---|
| 2009/0302681 A1* | 12/2009 | Yamada | ................ | H02J 7/35 307/46 |
| 2010/0236612 A1* | 9/2010 | Khajehoddin | ............ | G05F 1/67 136/252 |
| 2013/0181736 A1* | 7/2013 | Gostein | .................. | H02S 50/10 324/761.01 |
| 2013/0257153 A1* | 10/2013 | Krenz | ...................... | H02J 4/00 307/29 |
| 2015/0005979 A1 | 1/2015 | Itaya | | |
| 2015/0069950 A1* | 3/2015 | Ishibashi | .................. | H02J 3/32 320/101 |
| 2016/0204614 A1 | 7/2016 | Itaya | | |

FOREIGN PATENT DOCUMENTS

| | | |
|---|---|---|
| JP | 5389303 B1 | 1/2014 |
| JP | 5721915 B1 | 5/2015 |

OTHER PUBLICATIONS

International Search Report (PCT/ISA/210) dated Aug. 11, 2015, by the Japanese Patent Office as the International Searching Authority for International Application No. PCT/JP2015/065314.

Written Opinion (PCT/ISA/237) dated Aug. 11, 2015, by the Japanese Patent Office as the International Searching Authority for International Application No. PCT/JP2015/065314.

* cited by examiner

VOLTAGE CONTROL DEVICE AND VOLTAGE MEASUREMENT DEVICE

FIELD

The present invention relates to a voltage control device that controls a voltage control apparatus for controlling a voltage of a power distribution system and a voltage measurement device.

BACKGROUND

In general, a power distribution system includes a high-voltage system and a low-voltage system. A power receiving end of a general consumer is connected to the low-voltage system. A power company is obliged to maintain the voltage at the power receiving end of the general consumer in a proper range. As an example, in the case of power reception of 100 volts, the power company is obliged to maintain the voltage within a range of 95 volts to 107 volts. Therefore, the power company adjusts a control amount of a voltage control apparatus connected to the high-voltage system to maintain the voltage at the power receiving end of the general consumer. Note that, in the following explanation, unless specifically noted otherwise, the power distribution system indicates the high-voltage system.

In recent years, use of electricity is diversifying and the distributed power supplies by the use of solar power generation and the like are spreading; accordingly, a load distribution of a power distribution system tends to greatly fluctuate according to an elapse of time. It is becoming difficult to estimate a voltage state of the entire power distribution system only on the basis of information on voltage and current measured by the voltage control apparatus. Maintaining a proper voltage is a problem.

Patent Literature 1 discloses a technology for performing maintenance of a proper voltage at low cost without requiring a high-speed communication network. In the technology described in Patent Literature 1, the proper voltage is maintained by transmitting and receiving a small information amount among a plurality of voltage control devices and realizing a cooperative operation among the voltage control devices.

CITATION LIST

Patent Literature

Patent Literature 1: Japanese Patent No. 5389303

SUMMARY

Technical Problem

When there is a sudden change of electric power supplied from a distributed power that is supplied to a power distribution system, the voltage of the power distribution system also suddenly changes. In future, it is considered that distributed power supplies linked to power distribution system are diversified and the number of distributed power supplies linked to the power distribution system increases. It is predicted that sudden changes of the voltage of the power distribution system increase. On the other hand, in the technology described in Patent Literature described above, because it is determined whether a measured voltage is within the range of the proper voltage, the technology cannot cope with a sudden change. The voltage of the power distribution system is likely to deviate from the proper range.

The present invention has been devised in view of the above, and an object of the present invention is to obtain a voltage control device that can suppress occurrence of deviation from a proper range of a voltage of a power distribution system during a sudden change of the voltage of the power distribution system.

Solution to Problem

To solve the problems and achieve the object, a voltage control device according to an aspect of the present invention is a voltage control device that controls a voltage control apparatus such that a voltage is maintained within a range of a proper voltage upper limit value and a proper voltage lower limit value in a power-distribution-system voltage control system including a plurality of the voltage control apparatuses that are connected to a power distribution line of a high-voltage system and control a voltage of the power distribution line, the voltage control device including: a fluctuation calculating unit to calculate, using a voltage and active power measured by the voltage control apparatus, voltage tolerance, which is a difference between the voltage measured by the voltage control apparatus and a proper voltage upper limit value or a proper voltage lower limit value, and voltage sensitivity, which is a ratio of a fluctuation amount of the active power and a fluctuation amount of the voltage; and an upper/lower-limit-change-request-information generating unit to generate upper/lower limit change request information for requesting a change of an upper limit value or a lower limit value of a control target range of other voltage control devices. The voltage control device includes: an upper/lower-limit-change processing unit to perform a change of an upper limit value or a lower limit value of a control target range of the voltage control device according to content of the upper/lower limit change request information when the upper/lower limit change request information is received from an outside of the voltage control device; and a communication processing unit to receive the upper/lower limit change request information from the outside of the voltage control device and transmit the upper/lower limit change request information to the voltage control devices other than the voltage control device. The upper/lower limit change request information includes information indicating the voltage tolerance and the voltage sensitivity.

Advantageous Effects of Invention

The voltage control device according to the present invention achieves an effect that it is possible to suppress occurrence of deviation from a proper range of a voltage of a power distribution system during a sudden change of the voltage of the power distribution system.

DESCRIPTION OF EMBODIMENTS

A voltage control device and a voltage measurement device according to an embodiment of the present invention are explained in detail below with reference to the drawings. Note that the present invention is not limited by the embodiment.

Embodiment

Figure 1:
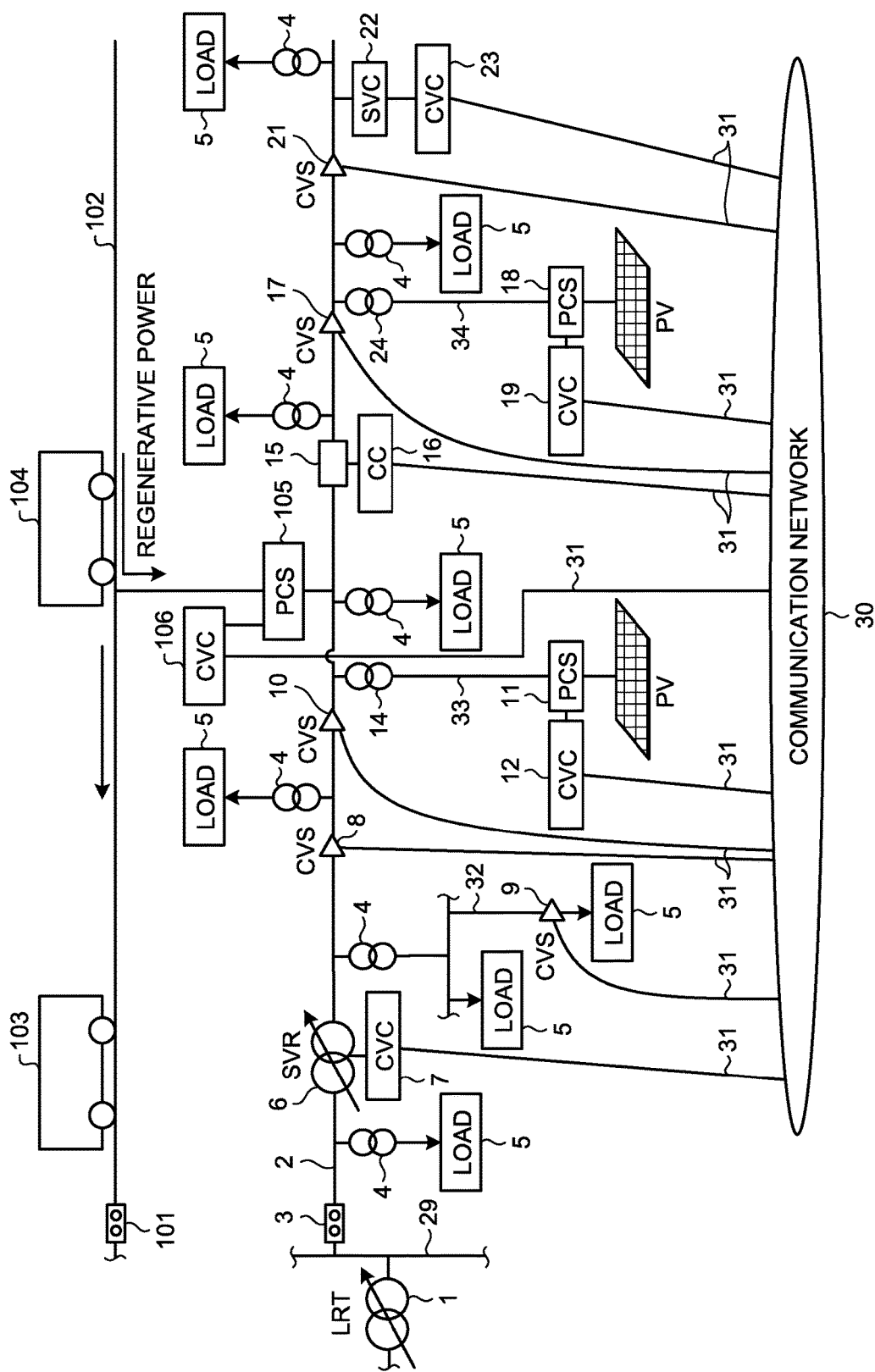
FIG. 1 is a diagram showing a configuration example of a power-distribution-system-voltage control system according to an embodiment of the present invention.

FIG. 1 is a diagram showing a configuration example of a power-distribution-system-voltage control system according to an embodiment of the present invention. In FIG. 1, a transformer for power distribution 1 is set in, for example, an electric power substation and includes an LRT (Load Ratio Control Transformer: an on-load tap switching transformer) functioning as a transformer for power distribution that can change a secondary-side voltage in a state in which a load current is fed, and a voltage control device that controls the LRT by adjusting a tap position of the LRT.

A bus 29 is connected to a secondary side of the transformer for power distribution 1. A power distribution line 2 is connected to the bus 29 via a breaker 3. The power distribution line 2 is a high-voltage power distribution line of a high-pressure system. A voltage level of the high-voltage system is usually 6600 volts. One end of the power distribution line 2 is connected to the bus 29 via the breaker 3. Note that, in FIG. 1, to simplify the figure, only one power distribution line 2 is drawn as being connected to the bus 29. Usually, a plurality of power distribution lines are connected to a bus on a secondary line of a transformer for power distribution. Each of the plurality of power distribution lines can be configured similarly.

One end of a power distribution line 102 of a feeding system, which is a direct-current system, is connected to a not-shown bus via a breaker 101. Regenerative power is supplied to the power distribution line 102 of the feeding system by deceleration of trains 103 and 104. Note that, in FIG. 1, the regenerative power supplied from the trains 103 and 104 to the power distribution line 102 is schematically shown. However, this does not show an actual connection form of the actual trains 103 and 104 and the power distribution line 102. The regenerative power is used in a power-running train and the like in the feeding system. However, excess electric power not used in the feeding system is supplied to the power distribution line 2 via a PCS (Power Conditioning System: a power conditioner) 105 for regeneration. In FIG. 1, an example is shown in which the train 104 is decelerating and the train 103 is power-running. In the case of this example, regenerative power generated by the deceleration of the train 104 is used in the train 103. Excess regenerative power is supplied to the power distribution line 2 via the PCS 105 for regeneration.

Cooperative voltage measurement devices (CVSs: Cooperative Voltage Sensors) 8, 10, 17, and 21 are connected to the power distribution line 2. The cooperative voltage measurement devices 8, 10, 17, and 21 can measure the voltages in their setting places, that is, at ends of the cooperative voltage measurement devices 8, 10, 17, and 21. Note that, in this embodiment, voltage control of the power distribution system is performed using only a voltage measurement value without using current measurement value. This is because, according to the spread of distributed power supplies such as solar power generation in recent years, the current measurement value is likely to be extremely small depending on a measurement point and an extremely large error is likely to be included in the current measurement value. The cooperative voltage measurement devices 8, 10, 17, and 21 are connected to a communication network 30 via a network cable 31.

An SVR (Step Voltage Regulator: an automatic voltage regulator) 6 for voltage drop compensation is connected to the power distribution line 2 as a voltage control apparatus. A cooperative voltage control device (CVC: Cooperative Voltage Controller) 7 that controls the SVR 6 is connected to the SVR 6. The cooperative voltage control device 7 is configured integrally with or juxtaposed to the SVR 6. The cooperative voltage control device 7 controls the SVR 6 by adjusting a control amount of the SVR 6, specifically, by adjusting a tap position. The SVR 6 measures a voltage and active power in a setting place of the SVR 6 in the power distribution line 2, that is, at an end of the SVR 6. The cooperative voltage control device 7 is connected to the communication network 30 via the network cable 31.

For example, a static reactive power control device (SVC: Static Var Compensator) 22 is connected to the power distribution line 2 as a voltage control apparatus. A cooperative voltage control device (CVC) 23 that controls the SVC 22 is connected to the SVC 22. The cooperative voltage control device 23 is configured integrally with or juxtaposed to the SVC 22. The cooperative voltage control device 23 controls the SVC 22 by adjusting a control amount of the SVC 22, specifically, by adjusting a reactive power output. The SVC 22 measures a voltage and active power in a setting place of the SVC 22 in the power distribution line 2, that is, at an end of the SVC 22. The cooperative voltage control device 23 is connected to the communication network 30 via the network cable 31.

A switch 15 is provided on a line of the power distribution line 2. In a state in which the switch 15 is closed, an upstream side of the switch 15 of the power distribution line 2, that is, a side where the transformer for power distribution 1 is present, and a downstream side of the switch 15 are electrically connected. However, in a state in which the switch 15 is opened, the downstream side is disconnected from the upstream side. A connection control device (CC: Connection Controller) 16 is connected to the switch 15. The connection control device 16 is connected to the communication network 30 via the network cable 31. In the state in which the switch 15 is opened, the connection control device 16 interrupts communication between cooperative voltage control devices 12 and 19 explained below. However, in the state in which the switch 15 is closed, the connection control device 16 relays the communication between the cooperative voltage control devices 12 and 19. That is, the connection control device 16 has a function of interrupting communication and a function of relaying communication, and reflects an open/closed state of the switch 15 on a communication path between the cooperative voltage control devices 12 and 19.

A power distribution line 32 having a voltage lower than the voltage of the power distribution line 2 is connected to the power distribution line 2 via the transformer 4. A cooperative voltage measurement device 9 that measures a voltage and active power is connected to the power distribution line 32. The power distribution line 32 is a low-voltage power distribution line having a voltage level of 100 volts to 200 volts. The cooperative voltage measurement device (CVS) 9 is connected to the communication network 30 via the network cable 31. A load 5 is connected to the power distribution line 32. There is also a transformer 4 that is connected to the load 5 without connecting to the power distribution line 32 and the cooperative voltage measurement device 9.

A power distribution line 33 having a voltage lower than the voltage of the power distribution line 2 is connected to the power distribution line 2 via a transformer 14. For example, a power conditioner (PCS) 11 for solar power generation functioning as a voltage control apparatus is connected to the power distribution line 33. A cooperative voltage control device (CVC) 12 that controls the PCS 11 and a solar battery (PV: Photovoltaics), which is a power generation source, are connected to the PCS 11. The cooperative voltage control device 12 is configured integrally with or juxtaposed to the PCS 11. The cooperative voltage control device 12 controls the PCS 11 by adjusting a control amount of the PCS 11, specifically, by adjusting reactive power output by the PCS 11. The PCS 11 measures, for example, a voltage and active power at an end of the PCS 11, which is a setting place of the PCS 11 in the power distribution line 33. The cooperative voltage control device 12 is connected to the communication network 30 via the network cable 31.

A power distribution line 34 having a voltage lower than the voltage of the power distribution line 2 is connected to the power distribution line 2 via a transformer 24. For example, a power conditioner (PCS) 18 for solar power generation functioning as a voltage control apparatus is connected to the power distribution line 34. The cooperative voltage control device (CVC) 19 that controls the PCS 18 and a solar battery, which is a power generation source, are connected to the PCS 18. The cooperative voltage control device 19 is configured integrally with or juxtaposed to the PCS 18. The cooperative voltage control device 19 controls the PCS 18 by adjusting a control amount of the PCS 18, specifically, by adjusting reactive power output by the PCS 18. The PCS 18 measures, for example, a voltage and active power in a setting place of the PCS 18 in the power distribution line 34, that is, at an end of the PCS 18. The cooperative voltage control device 19 is connected to the communication network 30 via the network cable 31.

As explained above, the PCS 105 for regeneration converts direct-current power input from the power distribution line 102 of the feeding system into alternating-current power, and supplies the alternating-current power to the power distribution line 2. A cooperative voltage control device (CVC) 106 that controls the PCS 105 is connected to the PCS 105. The cooperative voltage control device 106 is configured integrally with or juxtaposed to the PCS 105. The cooperative voltage control device 106 is capable of controlling the PCS 105 by adjusting a control amount of the PCS 105, specifically, by adjusting reactive power output by the PCS 105. The PCS 105 measures a voltage and active power in a setting place of the PCS 105 in the power distribution line 34, that is, at an end of the PCS 105. The cooperative voltage control device 106 is connected to the communication network 30 via the network cable 31.

Note that the SVR 6 and the cooperative voltage control device 7 are disposed rather on a power supply side, that is, upstream than the PCS 11 and the cooperative voltage control device 12, the PCS 18 and the cooperative voltage control device 19, the SVC 22 and the cooperative voltage control device 23, and the cooperative voltage measurement devices 8, 9, 10, 17, and 21. In FIG. 1, the load 5 is connected to the power distribution line 2 via the transformer 4.

Note that FIG. 1 shows an example of a disposition configuration of the cooperative voltage control devices. In general, it is sufficient that two or more voltage control apparatuses and two or more cooperative voltage control devices each of which controls corresponding one of the two or more voltage control apparatuses, or one or more voltage control apparatuses, one or more cooperative voltage control devices each of which controls corresponding one of the one or more voltage control apparatuses, and one or more cooperative voltage measurement devices are disposed. The disposition of the cooperative voltage control devices is not limited to the configuration shown in FIG. 1. A voltage control apparatus of a transformer type has a voltage control characteristic for uniformly increasing and decreasing a voltage on a load side by changing a tap position but hardly increasing and decreasing a voltage on a power supply side. A voltage control apparatus of a reactive power adjustment type has a voltage control characteristic for uniformly increasing and decreasing a voltage on a load side by controlling reactive power supplied to a power distribution line, and increasing and decreasing a voltage in proportion to line impedance from the transformer for power distribution 1 on a power supply side.

In FIG. 1, the example of the connection to the communication network 30 via the network cable 31 is shown. However, the cooperative voltage measurement devices 8, 9, 10, 17, and 21, the cooperative voltage control devices 7, 12, 19, and 23, and the connection control device 16 can be connected to the communication network 30 wirelessly. The cooperative voltage measurement devices 8, 10, 17, and 21, the cooperative voltage control devices 7, 12, 19, and 23, and the connection control device 16 adjacent to one another can perform communication through the wireless line.

In the above explanation, the cooperative voltage measurement devices 8, 9, 10, 17, and 21 and the cooperative voltage control devices 7, 12, 19, and 23 measure a voltage and active power. However, the cooperative voltage measurement devices 8, 9, 10, 17, and 21 and the cooperative voltage control devices 7, 12, 19, and 23 can measure an electric current and the like other than the voltage and the active power. The voltage level of the high-voltage power distribution line and the voltage level of the low-voltage power distribution line explained above are an example and are not limited to the numerical values described above.

As shown in FIG. 1, when the regenerative power is supplied from the feeding system to the power distribution line 2, instantaneous and large regenerative power is supplied to the power distribution line 2 during deceleration of a train. To effectively utilize the regenerative power, it is desirable that the PCS 105 for regeneration regenerates active power to a rated capacity limit without supplying reactive power to the power distribution line 2. At this point, because the voltage of the power distribution line 2 suddenly rises, it is desired to properly reduce the voltage of the power distribution line 2 beforehand such that the voltage does not deviate from a proper range even when the sudden rise occurs.

On the other hand, in power generation by a solar battery, a power generation amount fluctuates as time elapses. A sudden change is likely to occur concerning the power generation amount by the solar battery. It is desired to properly reduce the voltage of the power distribution line 2 beforehand such that a voltage does not deviate from a proper range even when such a change occurs.

Therefore, in this embodiment, a fluctuation width, that is, a fluctuation amount due to a sudden change of active power that occurs due to supply of regenerative power and fluctuation in a power generation amount is predicted. A predictive fluctuation amount of a voltage, that is, a predictive value of a fluctuation amount of the voltage is calculated using the predicted fluctuation amount. Occurrence of deviation from the proper range is suppressed during a sudden change of the voltage by adjusting the voltage beforehand through cooperative control. In the following explanation, the cooperative control of a voltage in this embodiment is explained.

The cooperative voltage control devices 7, 12, 19, 23, and 106 are voltage control devices that control a voltage in cooperation with the other devices in the power-distribution-system-voltage control system.

The configuration of the cooperative voltage measurement devices 8, 9, 10, 17, and 21 is explained. Note that the cooperative voltage measurement device 8 is explained below. However, the same explanation is applied to the cooperative voltage measurement devices 9, 10, 17, and 21. The cooperative voltage measurement device 8 can perform measurement of a voltage and active power, calculation and monitoring using the voltage and the active power, and generation and transmission of upper/lower limit change request information explained below. Note that, in the following explanation, the upper/lower limit change request information is abbreviated as request as appropriate. The measurement means measuring a voltage and active power at an end of the cooperative voltage measurement device 8. The calculation using the voltage and the active power is explained below. The monitoring means monitoring whether the voltage is within a proper range on the basis of a result of the measurement of the voltage and the active power and a result of the calculation using the voltage and the active power.

Figure 2:
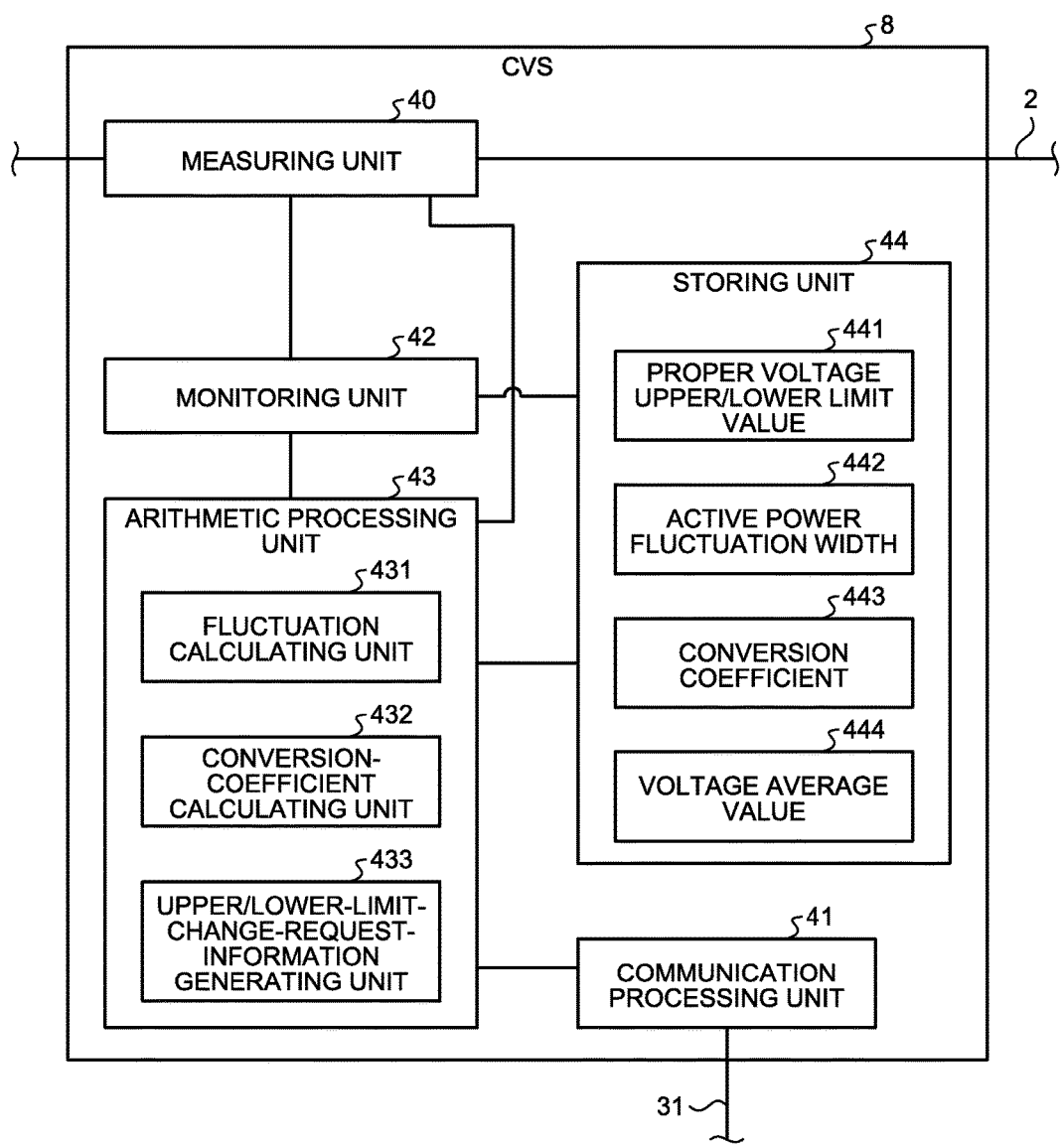
FIG. 2 is a diagram showing an example of the configuration of a cooperative voltage measurement device.

FIG. 2 is a diagram showing an example of the configuration of the cooperative voltage measurement device 8. As shown in FIG. 2, the cooperative voltage measurement device 8 includes a measuring unit 40 that measures a voltage and active power, a communication processing unit 41 that performs communication processing, a monitoring unit 42 that monitors the voltage and the active power measured by the measuring unit 40, an arithmetic processing unit 43 that performs various arithmetic operations, and a storing unit 44.

The measuring unit 40 is connected to the power distribution line 2 and measures a voltage V and active power P at an end of the measuring unit 40 at every first cycle. The first cycle can be set to 0.1 second as an example. The monitoring unit 42 monitors the voltage V and the active power P measured by the measuring unit 40, acquires the voltage V and the active power P at every second cycle, and sends the voltage V and the active power P to the arithmetic processing unit 43. The second cycle can be any value as long as the second cycle is an integer times as large as the first cycle. The second cycle can be set to one second as an example.

A proper voltage upper/lower limit value 441 is stored in the storing unit 44 in advance. The proper voltage upper/lower limit value 441 includes a proper voltage upper limit value and a proper voltage lower limit value, and specifies a proper range of a voltage that should be maintained concerning a section of power distribution line 2 including a voltage measurement point of the cooperative voltage measurement device 8. Note that the proper voltage upper/lower limit value 441 can also be variably set in terms of time.

The arithmetic processing unit 43 executes various kinds of arithmetic processing. Specifically, a fluctuation calculating unit 431 of the arithmetic processing unit 43 saves a measurement value of a voltage output from the monitoring unit 42 in the storing unit 44 for a first fixed period. The fluctuation calculating unit 431 of the arithmetic processing unit 43 calculates a fluctuation amount $\Delta P$ at every second cycle of the active power P and a fluctuation amount $\Delta V$ at every second cycle of the voltage V. $\Delta P$ is a fluctuation amount of active power per unit time, that is, the second cycle. $\Delta V$ is a fluctuation amount of a voltage per unit time, that is, the second cycle. Specifically, when a measurement value of i-th input active power among inputs at every second cycle from the monitoring unit 42 is represented as $p(i)$, the fluctuation calculating unit 431 calculates $\Delta P$ as $\Delta P = p(i) - p(i-1)$. When a measurement value of an i-th voltage input among inputs at every second cycle from the monitoring unit 42 is represented as $v(i)$, the fluctuation calculating unit 431 calculates $\Delta V$ as $\Delta V = v(i) - v(i-1)$.

The fluctuation calculating unit 431 of the arithmetic processing unit 43 saves $\Delta P$ and $\Delta V$ in the storing unit 44 for a second fixed period. As an example, the second fixed period can be set to ten minutes when the second fixed period corresponds to a voltage control apparatus connected to a solar battery, and can be set to one day when the second fixed period corresponds to a voltage control apparatus to which regenerative power is input. Further, the fluctuation calculating unit 431 of the arithmetic processing unit 43 predicts a fluctuation width of active power during a voltage sudden change. Specifically, the fluctuation calculating unit 431 calculates a maximum value $\Delta P$ max of a fluctuation amount on a positive side and a maximum value $\Delta P$ max' of a fluctuation amount on a negative side of $\Delta P$ in a closest third fixed period among $\Delta P$ stored in the storing unit 44, and stores $\Delta P$ max and $\Delta P$ max' in the storing unit 44 as an active power fluctuation width 442. The active power fluctuation width 442 is a predicted value of a fluctuation width of active power during a voltage sudden change. $\Delta P$ max is the absolute value of a maximum fluctuation amount at the time when P changes in an increasing direction, that is, on the positive side. $\Delta P$ max' is the absolute value of a maximum fluctuation amount at the time when P changes in a decreasing direction, that is, on the negative side. The third fixed period is a period equal to or shorter than the second fixed period and can be set according to a fluctuation state of a voltage in a setting place of the cooperative voltage measurement device 8. The third fixed period is set to a first period Tm1 in a place where a main cause of a sudden change of a voltage is regenerative power. The third fixed period is set to a second period Tm2 that is shorter than the first period Tm1 in a place where the main cause of the sudden change of the voltage is solar power generation. As an example, the first period can be set to a half day and the second period Tm2 can be set to ten minutes.

Figure 3:
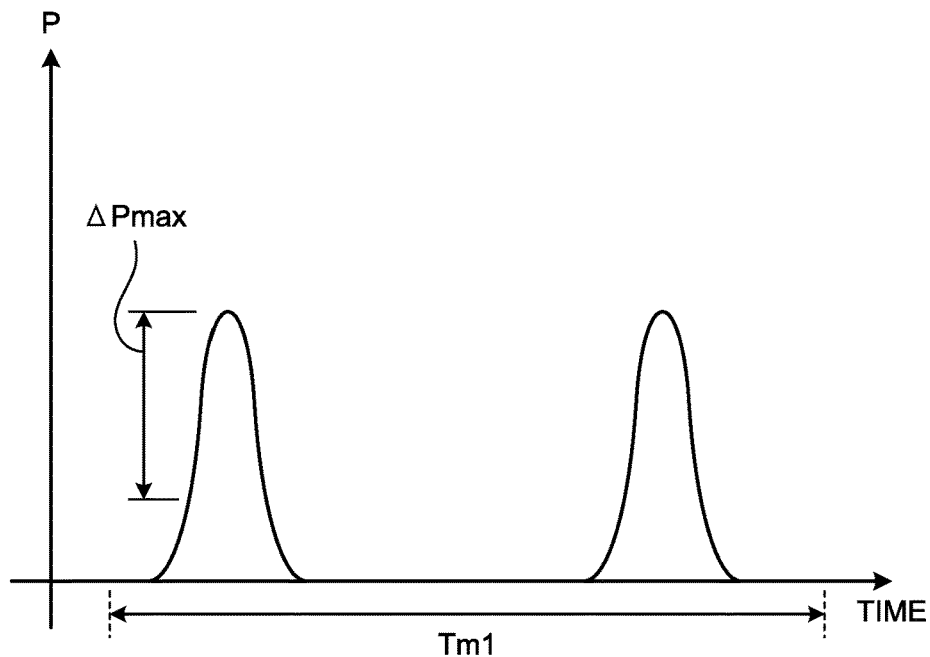
FIG. 3 is a diagram showing an example of a temporal change of active power output by a PCS that converts regenerative power into alternating-current power.
Figure 4:
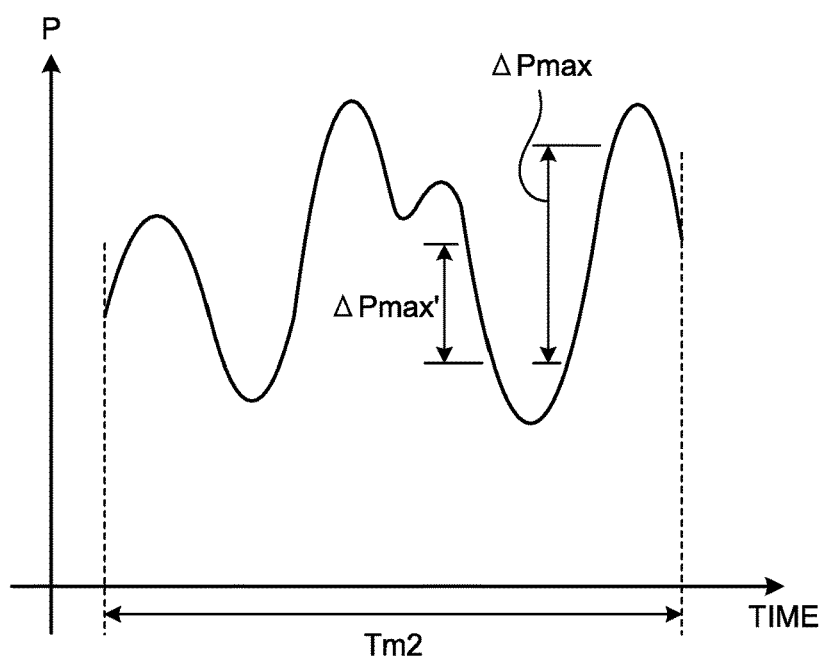
FIG. 4 is a diagram showing an example of a temporal change of active power output by a PCS connected to a solar battery.

FIG. 3 is a diagram showing an example of a temporal change of the active power P output by the PCS 105 that converts regenerative power into alternating-current power. FIG. 4 is a diagram showing an example of a temporal change of the active power P output by the PCS 11 connected to a solar battery. As shown in FIG. 3, the active power P output by the PCS 105 that converts reactive power into alternating-current power is 0 in a substantial period. However, the active power P suddenly rises during deceleration of a train. Therefore, ΔP max occurs during deceleration of the train. Fluctuation of the active power P output by the PCS 11 connected to the solar battery is various. A power generation amount by the solar battery greatly fluctuates in one day. Therefore, when the second period Tm2 is set to one day, the fluctuation is likely to include long-term fluctuation as well. Therefore, the second period Tm2 is set shorter than the first period Tm1.

A conversion-coefficient calculating unit 432 of the arithmetic processing unit 43 calculates, on the basis of the ΔP and ΔV in the second fixed period stored in the storing unit 44, a conversion coefficient 443 for converting a fluctuation amount of active power into a fluctuation amount of a voltage and stores the conversion coefficient 443 in the storing unit 44. Specifically, the conversion-coefficient calculating unit 432 of the arithmetic processing unit 43 calculates a conversion coefficient as explained below. ΔP and ΔV calculated when measurement values of the i-th voltage and the i-th active power are input from the monitoring unit 42 are represented as Δp(i) and Δv(i). When Δp(i) is larger than a threshold "a", the conversion-coefficient calculating unit 432 calculates, according to the following Expression (1), a conversion coefficient G for converting a fluctuation amount of active power into a fluctuation amount of a voltage.

When Δp(i)>a, $$G(i) = b \times \Delta v(i)/\Delta p(i) + (1-b)G(i-1)$$

When Δp(i)≤a, $$G(i) = G(i-1) \quad (1)$$

where, "a" is a value larger than 0 and is a threshold for taking into account only Δv(i)/Δp(i) at the time when P significantly changes in the calculation of the conversion coefficient G, and "b" is a constant smaller than 1.

Note that the above Expression (1) is equivalent to calculating the coefficient G with a first-order lag filter. However, instead of calculating the conversion coefficient G using the first-order lag filter, a moving average, a section average, or the like for the second fixed period of Δv(i)/Δp(i), in which Δp(i)>a, can be calculated as the conversion coefficient G.

Note that, to remove fluctuation at a short cycle of a voltage and active power, as v(i) and p(i), rather than using measurement values themselves, values obtained by smoothing the voltage and the active power acquired by the monitoring unit 42 with a first-order lag filter with a time constant set shorter than that in the above Expression (1) or moving averages, section averages, or the like of the voltage and the active power acquired by the monitoring unit 42 can be used. As an example, when the second cycle, which is a cycle at which the monitoring unit 42 acquires a voltage and active power, is set to one second, moving averages of the voltage and the active power for ten seconds are calculated at every second cycle. The moving average of the voltage calculated at every second cycle is used as v(i) and the moving average of the active power calculated at every second cycle is used as p(i). When ΔP max is calculated, similarly, Δp calculated by using a value obtained by smoothing the active power with the first-order lag filter, a moving average, or a section average of the active power, or the like can be used as p(i).

In the above (1), instead of Δp(i) and Δ(i), values obtained by smoothing respective Δp(i) and Δ(i) with a first-order lag filter with a time constant set shorter than that in the above Expression (1) can be used. Alternatively, instead of Δp(i) and Δ(i), moving averages, section averages, and the like of Δp(i) and Δ(i) in a short period can be used.

Every time the fluctuation calculating unit 431 acquires a latest measurement value of a voltage from the monitoring unit 42, the fluctuation calculating unit 431 calculates a voltage average 444, which is an average in the first fixed period of measurement values of a voltage, using measurement values of the voltage in the past and the latest voltage measurement value already saved in the storing unit 44 and stores the voltage average 444 in the storing unit 44. The voltage average 444 is retained in the storing unit 44 for a period decided in advance. That is, a history of voltage averages is retained in the storing unit 44. The second fixed period is set shorter than the first fixed period. As an example, the first fixed period can be set to several seconds to several minutes.

The arithmetic processing unit 43 has, besides the arithmetic processing function explained above, a function of issuing upper/lower limit change request information for changing upper and lower limit values of control target ranges in voltage control apparatuses. That is, the arithmetic processing unit 43 includes an upper/lower-limit-change-request-information generating unit 433 that issues upper/lower limit change request information. When a value obtained by adding or subtracting, to or from the latest voltage average 444, a value obtained by converting a predicted value of a fluctuation width of active power into a voltage deviates from a range specified by the proper voltage upper/lower limit value 441, that is, a proper range, the upper/lower-limit-change-request-information generating unit 433 generates upper/lower limit change request information. Specifically, when a value obtained by adding ΔV max to the latest voltage average 444 is larger than the proper voltage upper limit value or a value obtained by subtracting ΔV max' from the latest voltage average 444 is smaller than the proper voltage lower limit value, the upper/lower-limit-change-request-information generating unit 433 determines that the value is likely to deviate from the proper range. The upper/lower-limit-change-request-information generating unit 433 issues upper/lower limit change request information for changing the proper voltage upper and lower limits in a cooperative voltage control device to the cooperative voltage control device. ΔV max is a predicted value of a largest fluctuation amount on a positive side of the voltage and ΔV max' is a predicted value of a maximum fluctuation amount on a negative side of the voltage. Note that the upper/lower-limit-change-requestinformation generating unit 433 calculates ΔV max and ΔV max' according to the following Expressions (2) and (3).

$$\Delta V \text{ max} = \Delta P \text{ max} \times G \quad (2)$$

$$\Delta V \text{ max'} = \Delta P \text{ max'} \times G \quad (3)$$

The arithmetic processing unit 43 transmits the upper/lower limit change request information to a cooperative voltage control device decided in advance, for example, the cooperative voltage control device 12 via the communication processing unit 41. Note that the upper/lower limit change request information contains voltage tolerance explained below, direction information indicating whether the upper/lower limit change request information is a change request for an upper limit value or a change request for a lower limit value, and voltage sensitivity, which is the conversion coefficient G for converting a value indicating a change amount of a voltage with respect to a change in unit active power, that is, a fluctuation amount of the active power explained above into a fluctuation amount of the voltage. The voltage tolerance is the absolute value of a difference between the latest voltage average 444 and the proper voltage upper limit value or the absolute value of a difference between the voltage average 444 and the proper voltage lower limit value. Specifically, when a value obtained by adding ΔV max to the latest voltage average 444 is larger than the proper voltage upper limit value, ΔV max is stored in the upper/lower limit change request information as the voltage tolerance, information indicating the change request for the upper limit value is stored in the direction information, and the conversion coefficient G is stored in the voltage sensitivity. On the other hand, when a value obtained by subtracting ΔV max' from the latest voltage average 444 is smaller than the proper voltage lower limit value, ΔV max' is stored in the upper/lower limit change request information as the voltage tolerance, information indicating the change request for the lower limit value is stored in the direction information, and the conversion coefficient G is stored in the voltage sensitivity. The upper/lower-limit-change-request-information generating unit 433 calculates the voltage tolerance and stores the voltage tolerance in the upper/lower limit change request information.

Proper voltage upper and lower limit values are set in each of the cooperative voltage control devices. A range within the proper voltage upper and lower limit values is set as a control target range and voltage control is carried out such that a voltage is maintained within the control target range. However, when the upper/lower limit change request information is received, upper and lower limit values of the control target range are changed according to request content of the upper/lower limit change request information.

The communication processing unit 41 is connected to the network cable 31 and executes communication processing. Note that the configuration explained above is the same concerning the cooperative voltage measurement devices (CVSs) 10, 17, and 21. In FIG. 2, when the power distribution line 2 is changed to the power distribution line 32, the configuration is the same concerning the cooperative voltage measurement device 9.

Next, the configuration of the cooperative voltage control device is explained. The cooperative voltage control device performs collection, calculation, and monitoring of measurement values of a voltage and active power from the voltage control apparatus, issuing a target voltage value command to the voltage control apparatus, and the like. The cooperative voltage control device has a function of issuing upper/lower limit change request information. The collection means acquiring, from the voltage control apparatus, a voltage value and active power at an end of the voltage control apparatus measured at every fixed cycle by the voltage control apparatus. The calculation means performing calculation for calculating a voltage average, ΔP max and ΔP max', the conversion coefficient G, and the like on the basis of the collected voltage value and the collected active power. The monitoring means monitoring voltage fluctuation. The target voltage value command is a command output to the voltage control apparatus such that a voltage at the end of the voltage control apparatus is controlled to be within a proper voltage upper/lower limit value. The upper/lower limit change request information is issued when a value obtained by adding or subtracting a predicted fluctuation amount to or from the latest voltage average deviates from a proper voltage upper/lower limit value as in the case of the cooperative voltage measurement device.

Figure 5:
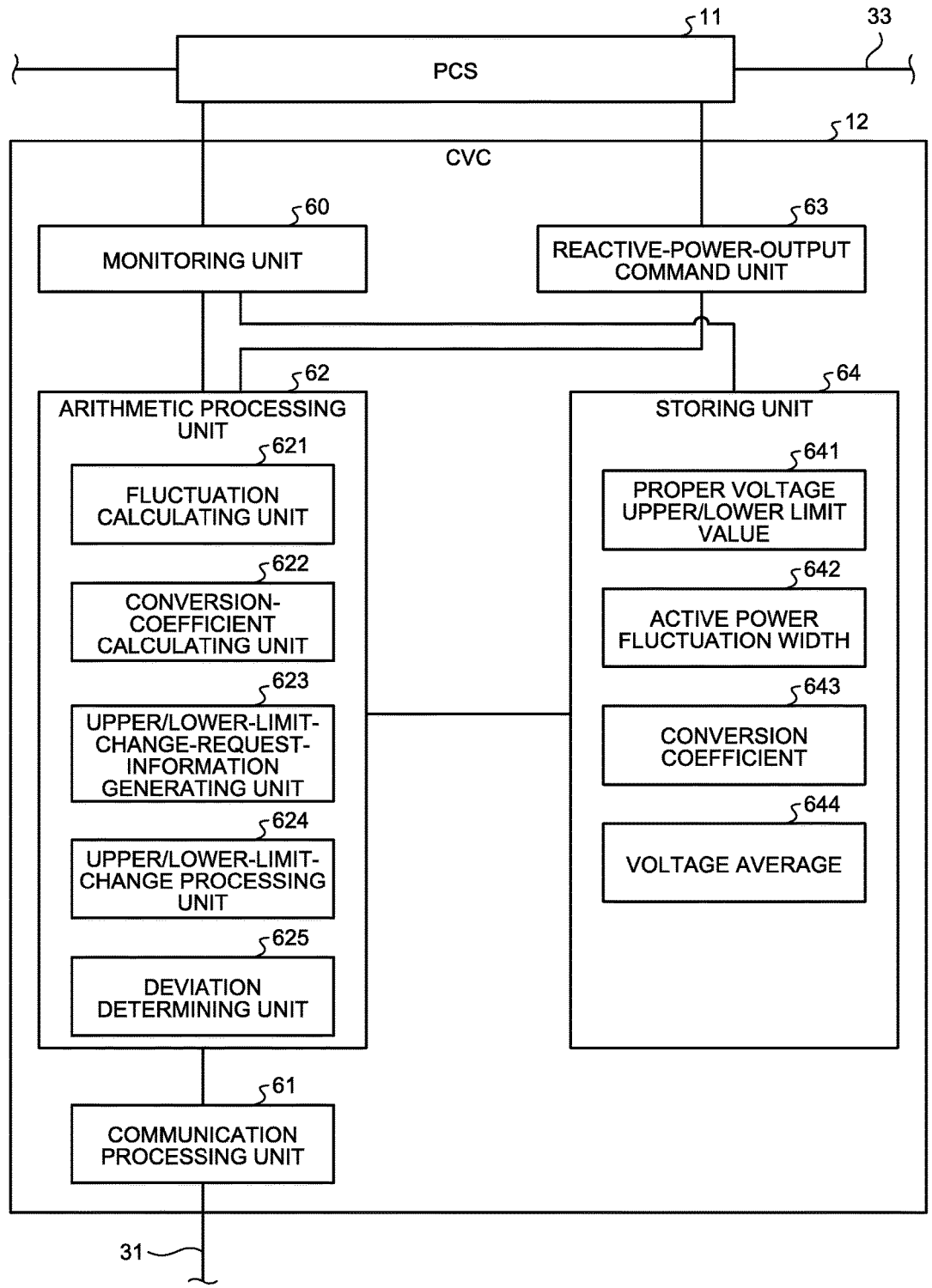
FIG. 5 is a diagram showing an example of the configuration of a cooperative voltage control device.

FIG. 5 is a diagram showing an example of the configuration of the cooperative voltage control device 12. As shown in FIG. 5, the cooperative voltage control device 12 includes a monitoring unit 60 that acquires a voltage and active power from a voltage control apparatus, a communication processing unit 61 that performs communication processing, an arithmetic processing unit 62 that performs various arithmetic operations, a reactive-power-output command unit 63 that generates and outputs a reactive power output command, and a storing unit 64.

The monitoring unit 60 acquires, at every first cycle, the voltage V measured by the PCS 11, which is a control target voltage command apparatus, and sends the voltage V to the arithmetic processing unit 62. It is assumed that the first cycle is the same as the first cycle, which is the measurement cycle of the measuring unit 40 of the cooperative voltage measurement device 8. Note that, the first cycle at which the monitoring unit 60 acquires the voltage V and the first cycle, which is the measurement cycle of the measuring unit 40 of the cooperative voltage measurement device 8, can be different. The monitoring unit 60 acquires, at every second cycle, the voltage V and the active power P measured by the PCS 11 and sends the voltage V and the active power P to the arithmetic processing unit 62. The second cycle, which is a cycle at which the monitoring unit 60 acquires the active power P, is the same as the second cycle, which is the cycle at which the monitoring unit 42 of the cooperative voltage measurement device 8 acquires a voltage and active power. The second cycle, which is the cycle at which the monitoring unit 60 acquires the active power P, and the second cycle, which is the cycle at which the monitoring unit 42 of the cooperative voltage measurement device 8 acquires a voltage and active power, can be different.

A proper voltage upper/lower limit value 641 is stored in the storing unit 64 in advance. The proper voltage upper/lower limit value 641 includes a proper voltage upper limit value and a proper voltage lower limit value, and specifies a proper range of a voltage concerning a section of the power distribution line 2 including a voltage measurement point of the PCS 11. Note that the proper voltage upper/lower limit value 641 can also be variably set in terms of time. Note that, as explained below, the cooperative voltage control device 12 changes control target which includes upper and lower limit values on the basis of upper/lower limit change request information. However, the proper voltage upper/lower limit value 641 stored in the storing unit 64 is a value serving as an initial value (a default value) in a control target range.

A fluctuation calculating unit 621 and a conversion-coefficient calculating unit 622 in the arithmetic processing unit 62 respectively perform arithmetic operations same as the arithmetic operations of the fluctuation calculating unit 431 and the conversion-coefficient calculating unit 432 of the cooperative voltage measurement device 8. An active power fluctuation width 642 and a conversion coefficient 643 of the storing unit 64 are the same as the active power fluctuation width 442 and the conversion coefficient 443 of the cooperative voltage measurement device 8, calculated by an arithmetic operation of the arithmetic processing unit 62, and stored in the storing unit 64. An upper/lower-limit-change-request-information generating unit 623 of the arithmetic processing unit 62 transmits the upper/lower limit change request information to a cooperative voltage control device decided in advance via the communication processing unit 61.

The upper/lower-limit-change-request-information generating unit 623 of the arithmetic processing unit 62 performs processing same as the processing by the upper/lower-limit-change-request-information generating unit 433. Note that the upper/lower-limit-change-request-information generating unit 623 can predict a change amount of a voltage at the time when the PCS 11 controls the voltage to a limit of a control ability and generate, taking into account the change amount of the voltage, upper/lower limit change request information when the voltage deviates from a proper range. In this case, the PCS 11 measures reactive power Q as well. The monitoring unit 60 acquires the reactive power Q as well from the PCS 11. The upper/lower-limit-change-request-information generating unit 623 of the arithmetic processing unit 62 calculates a conversion coefficient $\Delta V/\Delta Q$ concerning reactive power and a voltage in the same manner as the calculation of $\Delta V/\Delta P$. The upper/lower-limit-change-request-information generating unit 623 calculates maximum reactive power Q which can be output, on the basis of information concerning rating of the PCS 11 and active power and reactive power currently being output, and calculates a voltage change amount $\Delta Vc$ at the time when the maximum reactive power Q is output. The upper/lower-limit-change-request-information generating unit 623 determines that the voltage deviates from the proper range when a value obtained by subtracting the voltage change amount $\Delta Vc$ from a value obtained by adding $\Delta V$ max to the latest voltage average is larger than the proper voltage upper limit value or when a value obtained by adding the voltage change amount $\Delta Vc$ to a value obtained by subtracting $\Delta V$ max' from the latest voltage average is smaller than the proper voltage lower limit value.

Like the arithmetic processing unit 43 of the cooperative voltage measurement device 8, the arithmetic processing unit 62 calculates a voltage average 644, which is an average in the first fixed period of measurement values of the voltage by the use of measurement values of the voltage in the past already saved in the storing unit 64 and the latest voltage measurement value and stores the voltage average 644 in the storing unit 64. The calculated voltage average 644 is retained in the storing unit 64 for a period decided in advance.

When receiving upper/lower limit change request information from another cooperative voltage control device or the cooperative voltage measurement device, an upper/lower-limit-change processing unit 624 of the arithmetic processing unit 62 updates an upper limit value or a lower limit value of a control target range on the basis of voltage tolerance and direction information included in the upper/lower limit change request information.

A deviation determining unit 625 compares the voltage input at the first cycle and the control target range and determines presence or absence of deviation from the control target range. Specifically, the deviation determining unit 625 determines that deviation is present when the voltage is larger than the upper limit value of the control target range or the voltage is smaller than the lower limit value of the control target range. When the deviation continues, the deviation determining unit 625 adds up deviation amounts to calculate an integrated value of the deviation amounts. When deviation is absent, the deviation determining unit 625 resets the integrated value of the deviation amounts. When the integrated value of the deviation amounts is larger than a threshold decided in advance, the deviation determining unit 625 generates a voltage command according to PID (Proportional Integral Derivative) control to keep the voltage within the control target range and outputs the voltage command to the reactive-power-output command unit 63. The reactive-power-output command 63 outputs the input voltage command to the PCS 11 as a reactive power output command. The PCS 11 outputs the reactive power Q according to the reactive power output command to perform control of the voltage. The cooperative voltage control device 12 of the reactive power type can include a not-shown reactive power attenuating mechanism for gradually reducing, at a time constant of approximately one second, a reactive power amount to be commanded and avoid an unnecessary reactive power loss.

The configuration explained above is common to the cooperative voltage control device of the reactive power type. That is, concerning the cooperative voltage control devices 19, 23, and 106, a configuration same as the configuration of the cooperative voltage control device 12 shown in FIG. 5 is realized. However, because the cooperative voltage control device 106 controls the PCS 105 that supplies regenerative power to the power distribution line 2, the cooperative voltage control device 106 does not have to have a function of receiving upper/lower limit change request information from the other devices and changing the upper and lower limit values of the control target range.

Note that in the case of the cooperative voltage control device 106 that controls the PCS 105 that supplies regenerative power to the power distribution line 2, it is highly likely that active power is output to a limit of active power that can be output at the rating of the PCS 105. In such a case, $\Delta P$ max can be set in advance on the basis of the rating of the PCS 105 instead of being calculated in the procedure explained above.

The cooperative voltage control device 7 that controls the SVR 6, which is the voltage control apparatus of the transformer type, includes a tap-position-change command unit instead of the reactive-power-output command unit 63 of the cooperative voltage control device 12, and includes a deviation determining unit corresponding to control of a tap position instead of the deviation determining unit 625. Otherwise, the cooperative voltage control device 7 is the same as the cooperative voltage control device 8. When the deviation from the upper and lower limit values of the control target range of the voltage continues, the deviation determining unit of the cooperative voltage control device 7 adds up deviation amounts to thereby calculate an integrated value of the deviation amounts. When deviation is absent, the deviation determining unit resets the integrated value of the deviation amounts. When the integrated value of the deviation amounts is larger than a threshold decided in advance, the deviation determining unit generates a voltage command to keep the voltage within the upper and lower limit values of the control target range of the voltage and inputs the voltage command to the tap-position-change command unit. The tap-position-change command unit outputs the input voltage command to the SVR 6 as a tap position change command. The SVR 6 adjusts a tap position T according to the tap position change command to perform control of the voltage. Note that, for a reduction of the number of times of tap operation, the threshold concerning the integrated value of the deviation amounts is set large compared with the threshold of the cooperative voltage control device that controls the voltage control apparatus of the reactive power type. Note that, concerning the cooperative voltage control device 7 that controls the SVR 6, which is the voltage control apparatus of the transformer type, the upper/lower-limit-change-request-information generating unit 623 does not have to be provided or the function of the upper/lower-limit-change-request-information generating unit 623 can be disabled according to the configuration of the power distribution system. Alternatively, the generated upper/lower limit change request information does not have to be transmitted.

Initial values of the upper and lower limit values of the control target range, that is, values in a state in which upper/lower limit change request information is absent of the cooperative voltage control device 7 that controls the voltage control apparatus of the transformer type can be values obtained by adding and subtracting a fixed dead zone to and from a fixed value decided in advance or a fixed value decided according to a day of the week, a time period, or the like. Consequently, the cooperative voltage control device 7 performs voltage maintenance in a normal state without upper/lower limit change request information concerning a power distribution system load side. The dead zone can be set to 1% as an example.

Figure 6:
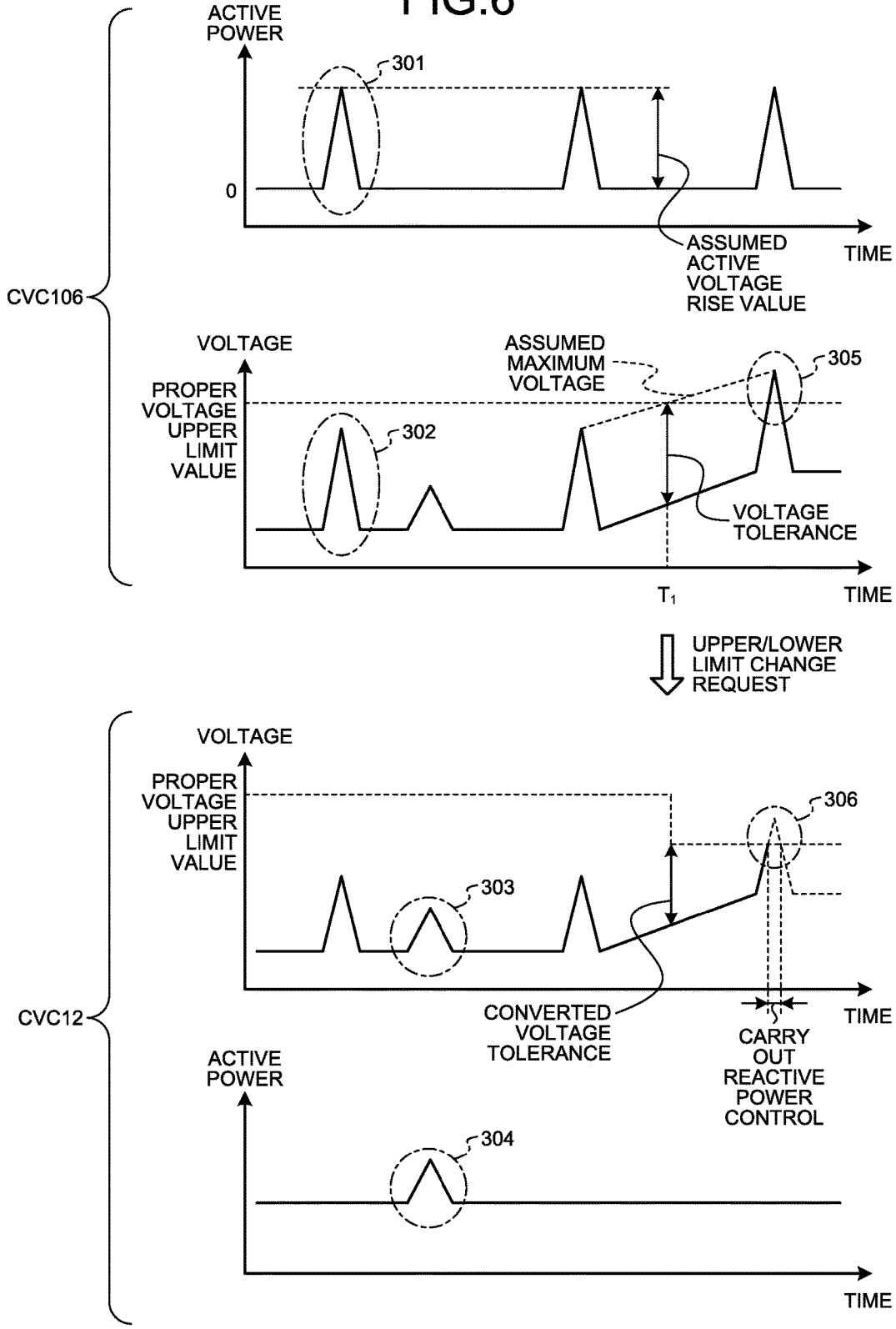
FIG. 6 is a diagram showing an example of control during issuance of upper/lower limit change request information in the embodiment.
Figure 7:
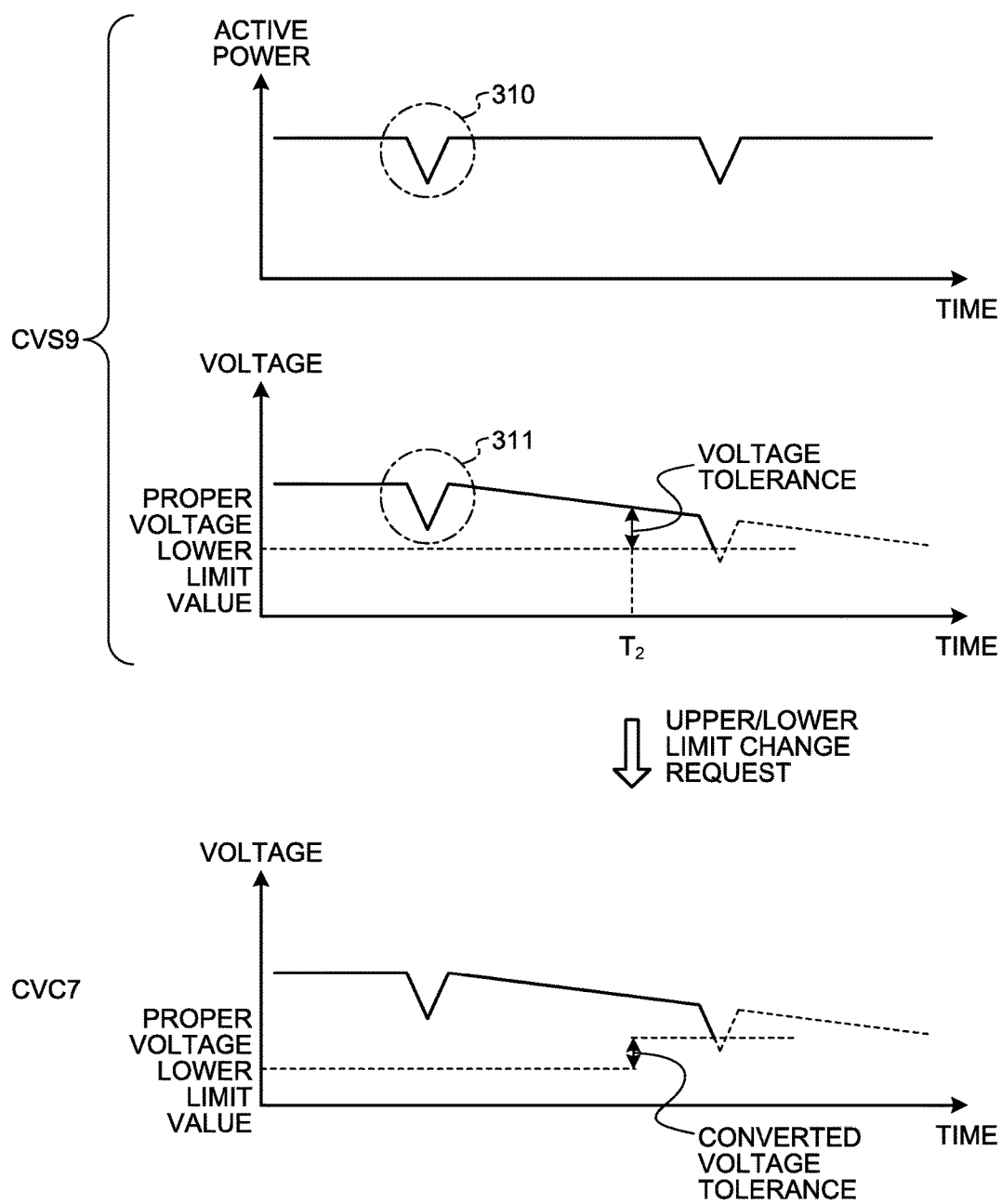
FIG. 7 is a diagram showing an example of the control during the issuance of the upper/lower limit change request information in the embodiment.

FIGS. 6 and 7 are diagrams showing examples of control during issuance of upper/lower limit change request information in this embodiment. In FIG. 6, an example is shown in which, as an example, the CVC 106 issues the upper/lower limit change request information. A first stage of FIG. 6 shows active power measured in the CVC 106. A second stage of FIG. 6 shows a voltage measured in the CVC 106. A third stage of FIG. 6 shows a voltage measured in the CVC 12. A fourth stage of FIG. 6 shows active power measured in the CVC 12.

It is assumed that, in the CVC 106, a maximum value of a fluctuation amount on a positive side in ΔP in the third fixed period, that is, ΔP max described above is an active power fluctuation amount 301 shown in FIG. 6 and a voltage fluctuation amount corresponding to the active power fluctuation amount 301 is a voltage fluctuation amount 302. In this case, as shown in the second stage of FIG. 6, it is assumed that, at time T$_1$, a value obtained by adding ΔV max to the latest voltage average indicating the present voltage is larger than the proper voltage upper limit value. At this point in time, voltage tolerance, which is a difference between the latest voltage average indicating the present voltage and the proper voltage upper limit value, is ΔV max. The CVC 106 issues upper/lower limit change request information at time T$_1$. In the upper/lower limit change request information, ΔV max is stored in voltage tolerance, a value indicating a change of an upper limit value is stored in direction information, and the conversion coefficient G indicating a degree of a change in the voltage with respect to a change in the active power is stored in voltage sensitivity. The upper/lower limit change request information issued from the CVC 106 is transmitted to the CVC 12.

When receiving the upper/lower limit change request information, the CVS 9 calculates converted voltage tolerance, which is voltage tolerance at an end of the CVS 9 according to the following Expression (4) on the basis of the voltage tolerance and the voltage sensitivity included in the upper/lower limit change request information, that is, voltage tolerance and voltage sensitivity of a request source and voltage sensitivity at the end of the CVS 9, that is, the conversion coefficient G calculated by the CVS 9.

Converted voltage tolerance=voltage tolerance of the request source×voltage sensitivity at the end of the CVS 9/voltage sensitivity of the request source (4)

The CVC 12 recognizes that the upper/lower limit change request information is a change request for the upper limit value on the basis of the direction information of the upper/lower limit change request information, and reduces the upper limit value of the control target range by the converted voltage tolerance. That is, the CVS 9 calculates the upper limit value according to the following Expression (5) and carries out control of reactive power using the calculated value as the upper limit value of the control target range.

Upper limit value=proper voltage upper limit value−converted voltage tolerance (5)

In FIG. 7, an example is shown in which, as an example, the CVS 9 issues upper/lower limit change request information. A first stage of FIG. 7 shows active power measured in the CVS 9. A second stage of FIG. 7 shows a voltage measured in the CVS 9. A third stage of FIG. 7 shows a voltage measured in the CVC 7.

It is assumed that, in the CVS 9, a maximum value of a fluctuation amount on a positive side in ΔP in the third fixed period, that is, ΔP max described above is an active power fluctuation amount 310 shown in FIG. 7, and a voltage fluctuation amount corresponding to the active power fluctuation amount 310 is a voltage fluctuation amount 311. In this case, as shown in the second stage of FIG. 7, it is assumed that, at time T$_2$, a value obtained by subtracting ΔV max' from the latest voltage average indicating the present voltage is smaller than the proper voltage lower limit value. At this point in time, voltage tolerance, which is a difference between the latest voltage average indicating the present voltage and the proper voltage lower limit value, is ΔV max'. The CVS 9 issues upper/lower limit change request information at time T$_2$. In the upper/lower limit change request information, ΔV max' is stored in voltage tolerance, a value indicating a change of a lower limit value is stored in direction information, and the conversion coefficient G indicating a degree of a change in the voltage with respect to a change in the active power is stored in voltage sensitivity. The upper/lower limit change request information issued from the CVS 9 is transmitted to the CVC 7.

When receiving the upper/lower limit change request information, the CVC 7 calculates converted voltage tolerance, which is voltage tolerance at an end of the CVC 7, according to the above Expression (4) on the basis of the voltage tolerance and the voltage sensitivity included in the upper/lower limit change request information, that is, voltage tolerance and voltage sensitivity of a request source and voltage sensitivity at the end of the CVC 7, that is, the conversion coefficient G calculated by the CVC 7.

The CVC 7 recognizes that the upper/lower limit change request information is a change request for the lower limit value on the basis of the direction information of the upper/lower limit change request information, and reduces the lower limit value of the control target range by the converted voltage tolerance. That is, the CVS 9 calculates the upper limit value according to the following Expression (6), and carries out control of reactive power using the calculated value as the lower limit value of the control target range.

$$\text{Lower limit value=proper voltage lower limit value−converted voltage tolerance} \quad (6)$$

As explained above, when the value obtained by adding ΔV max to the latest voltage average is larger than the proper voltage upper limit value or the value obtained by subtracting ΔV max' from the latest voltage average is smaller than the proper voltage upper limit value, the cooperative voltage measurement device and the cooperative voltage control device in this embodiment transmit the upper/lower limit change request information. The cooperative voltage control device that receives the upper/lower limit change request information changes the control target range on the basis of the upper/lower limit change request information. Therefore, when voltage fluctuation occurs in which the voltage of the cooperative voltage measurement device or the cooperative voltage control device at the request source of the upper/lower limit change request information actually is larger than the proper voltage range upper limit value or is smaller than the proper voltage range lower limit value, in a request destination, that is, the cooperative voltage control device that receives the upper/lower limit change request information, voltage fluctuation occurs in which the voltage is larger than the upper limit value of the control target range or is smaller than the lower limit value of the control target range.

The cooperative voltage control device at the request destination controls the voltage at the end of the cooperative voltage control device to be kept within the control target range. In this case, because the control target range is set according to the voltage tolerance of the request source as explained above, by performing such control, it is possible to keep the voltage in the cooperative voltage measurement device or the cooperative voltage control device at the request source within the range of the proper voltage. That is, the cooperative voltage control device at the request destination can start the control of the voltage when the voltage of the request source deviates from the proper voltage range, rather than immediately performing control for increasing or decreasing the voltage when the upper/lower limit change request information is received. In the example shown in FIG. 6, when the change of the upper and lower limits of the control target range is not performed, voltage fluctuation 305 occurs. However, voltage fluctuation 306 is suppressed to the upper limit value or less by the cooperative voltage control device by performing the change of the upper and lower limits of the control target range. As a result, deviation from the proper voltage range does not occur in the CVC 106 either. Consequently, it is possible to avoid useless reactive power control and keep the voltage of the request source within the proper voltage range.

For example, when a voltage fluctuation amount 303 shown in FIG. 6 occurs, if the upper/lower limit change request information is not transmitted, the voltage deviates from the proper voltage range as shown in FIG. 6. However, as shown in the third stage of FIG. 6, when the CVC 12 changes the upper limit value of the control target range on the basis of the upper/lower limit change request information, even when a voltage fluctuation amount 304 corresponding to the voltage fluctuation amount 303 occurs, the CVC 12 carries out the reactive power control such that the voltage is not larger than the upper limit value. Therefore, actually, the voltage fluctuation amount 304 is suppressed to the upper limit value or less of the control target range. Consequently, the voltage fluctuation amount 303 is also suppressed to the upper limit value or less of the proper voltage range. In this way, a point in time when deviation from the proper voltage upper limit value or the proper voltage lower limit value occurs at the request source and a point in time when the voltage deviates from the control target range at the request destination are set equal. The request destination controls the voltage to be kept within the control target range so as to prevent deviation from the proper voltage upper limit value or the proper voltage lower limit value at the request source. In other words, the cooperative voltage measurement device or the cooperative voltage control device at the request source transmits the upper/lower limit change request information. The cooperative voltage control device that receives the upper/lower limit change request information changes the upper limit value or the lower limit value of the control target range on the basis of the upper/lower limit change request information. Consequently, it is possible to adjust the upper limit value or the lower limit value of the control target range of the request destination to the upper limit value or the lower limit value of the proper voltage range of the request source. That is, it is possible to share the upper and lower limit values between the devices.

Note that the cooperative voltage control device sometimes receives upper/lower limit change request for requesting a change of the upper limit value from a plurality of different devices at request sources. In such a case, the cooperative voltage control device changes the upper limit value on the basis of upper/lower limit change request information including the smallest voltage tolerance. Similarly, when the cooperative voltage control device receives upper/lower limit change request information for requesting a change of the lower limit value from a plurality of different devices at request sources, the cooperative voltage control device changes the lower limit value on the basis of upper/lower limit change request information including the smallest voltage tolerance.

Figure 8:
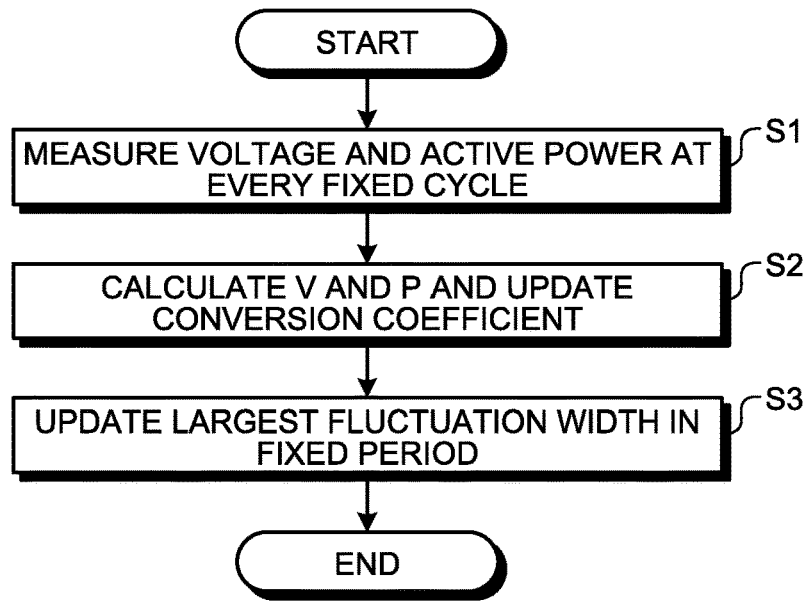
FIG. 8 is a flowchart showing an example of a processing procedure of prediction of a fluctuation width during a voltage sudden change.

Operation for issuance of upper/lower limit change request information in the cooperative voltage measurement device or the cooperative voltage control device is explained. First, prediction of a fluctuation width during a voltage sudden change is explained. FIG. 8 is a flowchart showing an example of a processing procedure of the prediction of a fluctuation width during a voltage sudden change. As explained above, the voltage control apparatus connected to the cooperative voltage measurement device or the cooperative voltage control device measures, at every first cycle, which is the fixed cycle, a voltage and active power at the end of the voltage control apparatus (step S1). The cooperative voltage measurement device or the cooperative voltage control device calculates ΔV and ΔP on the basis of a measurement result of the voltage and the active power at every second cycle, and updates the conversion coefficient G (step S2). The cooperative voltage measurement device or the cooperative voltage control device updates a largest fluctuation width, that is, an active power fluctuation width in the fixed period, that is, the third fixed period described above (step S3). The cooperative voltage measurement device or the cooperative voltage control device carries out the processing explained above at every second cycle to update the conversion coefficient and the active power fluctuation width in the storing unit 44 or the storing unit 64.

Figure 9:
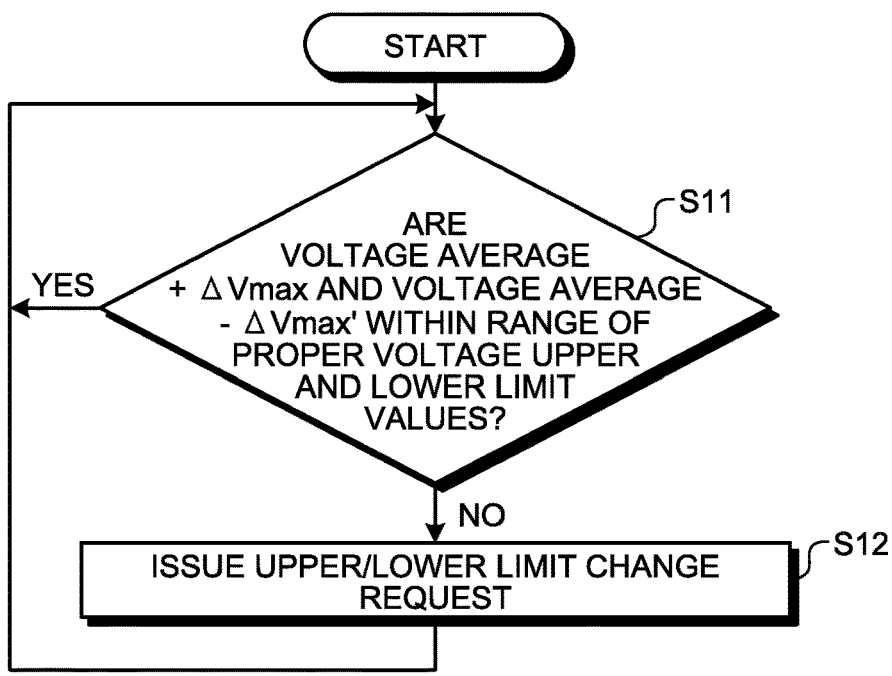
FIG. 9 is a flowchart showing an example of a processing procedure of the issuance of the upper/lower limit change request information.

Processing for issuance of upper/lower limit change request information is explained. FIG. 9 is a flowchart showing an example of a processing procedure for issuance of upper/lower limit change request information. The cooperative voltage measurement device or the cooperative voltage control device calculates ΔV max and ΔV max' using the active power fluctuation width and the conversion coefficient stored in the storing unit 44 or the storing unit 64, and determines whether the voltage average+ΔV max and the voltage average−ΔV max' stored in the storing unit 44 or the storing unit 64 are within the range of the proper voltage upper and lower limit values (step S11). When the voltage average+ΔV max or the voltage average−ΔV max' deviates from the range of the proper voltage upper and lower limit values (No at step S11), the cooperative voltage measurement device or the cooperative voltage control device issues upper/lower limit change request information (step S12). Specifically, the cooperative voltage measurement device or the cooperative voltage control device generates upper/lower limit change request information, and transmits the upper/lower limit change request information to a cooperative voltage control device at a transmission destination decided in advance. When the voltage average+ΔV max and the voltage average−ΔV max' are within the range of the proper voltage upper and lower limit values (Yes at step S11), the cooperative voltage measurement device or the cooperative voltage control device repeats step S11.

Note that, as explained above, at step S11, the cooperative voltage control device that controls the voltage control apparatus of the reactive power type can determine, taking into account a controllable amount, whether the voltage average+ΔV max−ΔVc or the voltage average−ΔV max'+ΔVc stored in the storing unit 44 or the storing unit 64 is within the range of the proper voltage upper and lower limit values.

Figure 10:
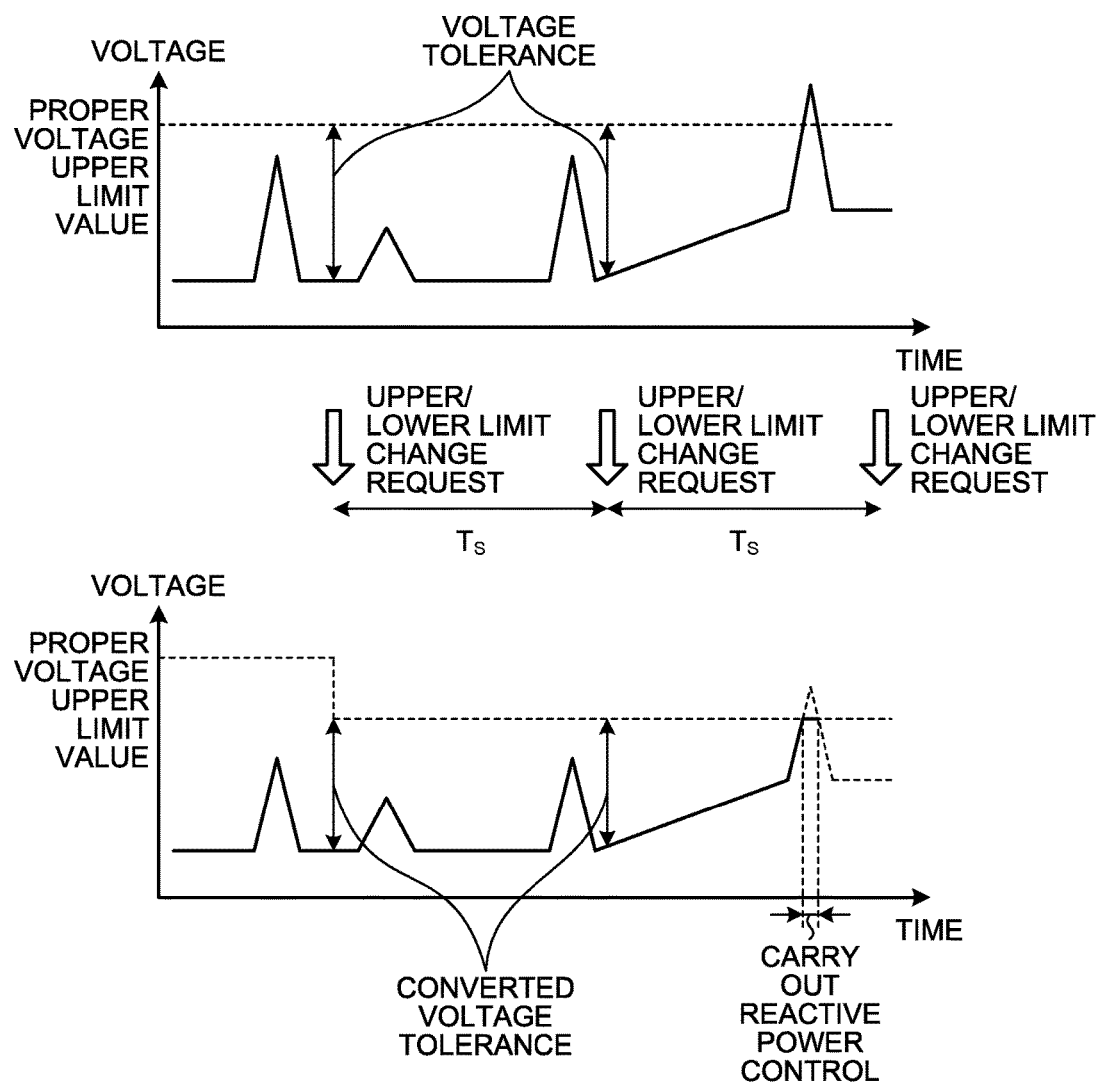
FIG. 10 is a diagram showing an example in which a CVC periodically transmits the upper/lower limit change request information.

Note that, in the above explanation, when the latest voltage average+ΔV max, that is, an assumed maximum voltage is larger than the proper voltage upper limit value or when the latest voltage average−ΔV max', that is, an assumed minimum voltage is lower than the proper voltage lower limit value, the upper/lower limit change request information is transmitted. However, timing for transmitting the upper/lower limit change request information is not limited to the example explained above. For example, the upper/lower limit change request information can be periodically transmitted irrespective of the voltage. FIG. 10 is a diagram showing an example in which the CVC 106 periodically transmits the upper/lower limit change request information. In the example shown in FIG. 10, the CVC 106 transmits the upper/lower limit change request information at every cycle Ts. When the upper/lower limit change request information is periodically transmitted in this way, the voltage tolerance is not ΔV max, ΔV max in the example explained above, and is smaller one of the absolute values of the differences between the latest voltage average and the proper voltage upper limit value and the proper voltage lower limit value at that point in time.

A target voltage changing operation of the cooperative voltage control device that receives upper/lower limit change request is explained. Note that not only the cooperative voltage control device that receives a request but also the cooperative voltage control device that issues the request can perform processing explained below. In the configuration example shown in FIG. 1, because the cooperative voltage control device that controls the PCS 105 for regeneration uses the regenerative power as much as possible, even when the cooperative voltage control device issues a request, the cooperative voltage control device does not have to perform a change of the proper voltage upper and lower limit values of the cooperative voltage control device on the basis of the request. On the other hand, the cooperative voltage control device 12 that controls the PCS 11 connected to the solar battery performs the following processing even when the cooperative voltage control device 12 issues a request. The cooperative voltage control device that receives the request changes the upper and lower limit values of the control target range based on the request, and fixes the proper voltage upper and lower limit values for a voltage cooperative control effective time preset concerning the cooperative voltage control devices. The voltage cooperative control effective time can be set to approximately one minute to ten minutes as an example.

Figure 11:
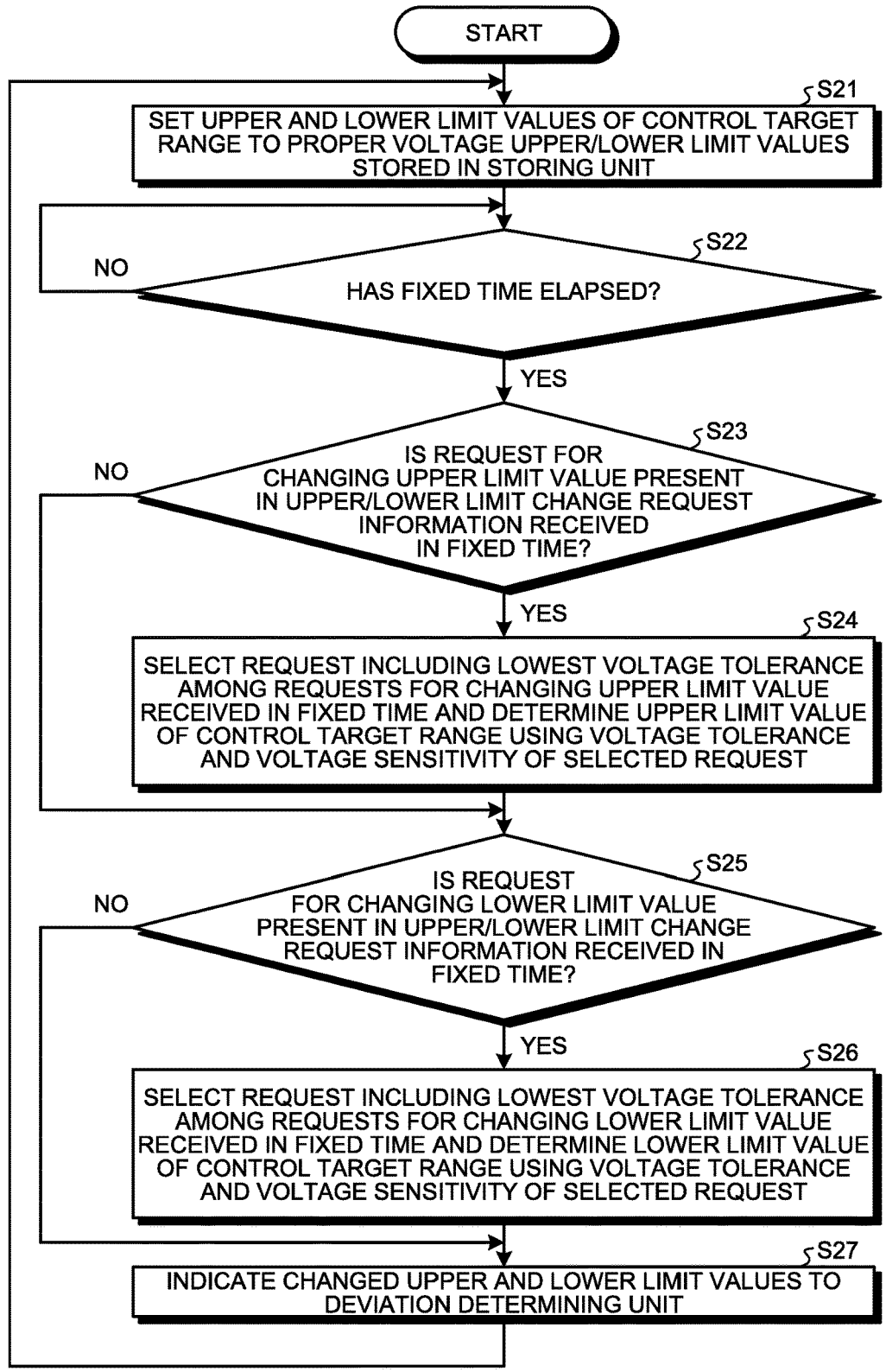
FIG. 11 is a flowchart showing processing of a target voltage change by the cooperative voltage control device that receives the upper/lower limit change request information.

FIG. 11 is a flowchart showing processing for a target voltage change by the cooperative voltage control device that receives upper/lower limit change request information. First, the upper/lower-limit-change processing unit 624 of the cooperative voltage control device sets the upper and lower limit values of the control target range to the proper voltage upper/lower limit value 641 stored in the storing unit 64 (step S21). Subsequently, the upper/lower-limit-change processing unit 624 determines whether a fixed time has elapsed (step S22). When the fixed time has not elapsed (No at step S22), the upper/lower-limit-change processing unit 624 repeats step S22. In the fixed period, when receiving upper/lower limit change request information, the cooperative voltage control device performs relay of a request. That is, the cooperative voltage control device transfers the received upper/lower limit change request information to the next cooperative voltage control device.

When the fixed time has elapsed (Yes at step S22), the upper/lower-limit-change processing unit 624 determines whether a request for changing the upper limit value is present in the upper/lower limit change request information received in the fixed time, that is, upper/lower limit change request information, direction information of which is a value indicating that the upper limit value is to be changed, is present (step S23). When the request for changing the upper limit value is present (Yes at step S23), the upper/lower-limit-change processing unit 624 selects a request including the lowest voltage tolerance among requests for changing the upper limit value received in the fixed time, and determines an upper limit value of the control target range using voltage tolerance and voltage sensitivity of the selected request (step S24). Specifically, the upper/lower-limit-change processing unit 624 calculates converted voltage tolerance according to the above Expression (4) using the voltage tolerance and the voltage sensitivity of the selected request and determines an upper limit value using Expression (5).

Subsequently, the upper/lower-limit-change processing unit 624 determines whether a request for changing the lower limit value is present in the upper/lower limit change request information received in the fixed time, that is, upper/lower limit change request information, direction information of which is a value indicating that the lower limit value is to be changed, is present (step S25). When the request for changing the lower limit value is present (Yes at step S25), the upper/lower-limit-change processing unit 624 selects a request including lowest voltage tolerance among requests for changing the lower limit value received in the fixed time, and determines a lower limit value of the control target range using the voltage tolerance and voltage sensitivity of the selected request (step S26). Specifically, the upper/lower-limit-change processing unit 624 calculates converted voltage tolerance according to the above Expression (4) using the voltage tolerance and the voltage sensitivity of the selected request, and determines upper and lower limit values using Expression (6).

Subsequently, the upper/lower-limit-change processing unit 624 indicates the changed control target range to the deviation determining unit 625 (step S27) and returns to step S21. As explained above, the deviation determining unit 625 determines whether the voltage measured by the measuring unit deviates from the indicated control target range.

Note that the fixed time used at step S22 can be set to one minute as an example in the cooperative voltage control device of the reactive power type. In the cooperative voltage control device that controls the voltage control apparatus of the transformer type, the fixed time used at step S22 can be set to thirty minutes as an example.

Figure 12:
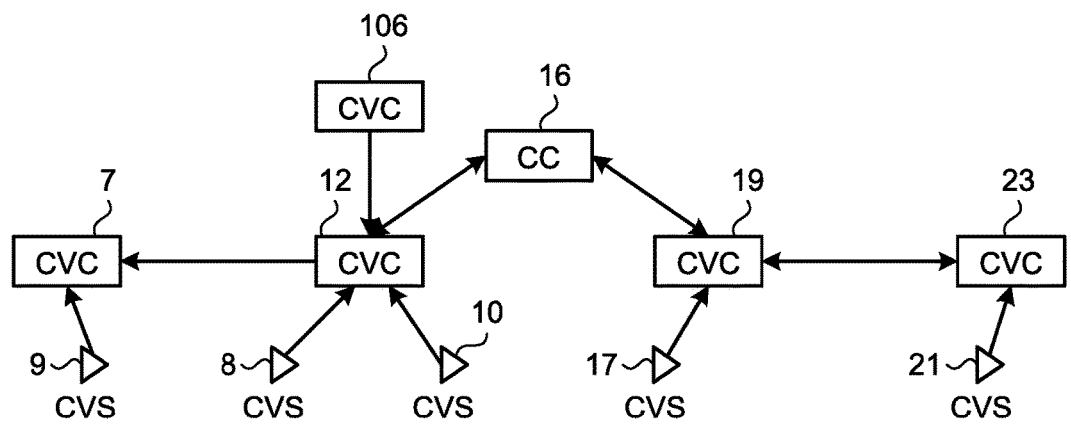
FIG. 12 is a diagram showing an example of a communication path, that is, a logical network, between cooperative voltage measurement devices and cooperative voltage control devices.

A relay scheme for a request is explained. FIG. 12 is a diagram showing an example of a communication path, that is, a logical network, between the cooperative voltage measurement devices and the cooperative voltage control devices. In FIG. 12, arrows represent transmittable directions of upper/lower limit change request information. A relay range of the upper/lower limit change request information is set to stay in the same power distribution line. As it is seen from comparison of FIG. 12 and FIG. 1, the logical network has a network configuration corresponding to an electric connection configuration of a cooperative voltage measurement device group, a cooperative voltage control device group, the connection control device 16, and a power distribution line group in the power distribution system shown in FIG. 1. That is, a disposition configuration of the cooperative voltage measurement device group, the cooperative voltage control device group, and the connection control device 16 corresponds to a connection relation of the cooperative voltage measurement device group, the cooperative voltage control device group, and the connection control device 16 in the power distribution system.

When the cooperative voltage measurement device does not receive upper/lower limit change request information from other devices and issues upper/lower limit change request information, the cooperative voltage measurement device transmits the generated upper/lower limit change request information to one or a plurality of cooperative voltage control devices predetermined. When receiving upper/lower limit change request information from another device, the cooperative voltage measurement device can transmit the received upper/lower limit change request information to one or a plurality of other cooperative voltage control devices predetermined. However, the cooperative voltage control device does not transmit the upper/lower limit change request information to a transmission source. When the cooperative voltage control device itself generates upper/lower limit change request information, the cooperative voltage control device transmits the upper/lower limit change request information to one or a plurality of other cooperative voltage control devices decided in advance.

Figure 13:
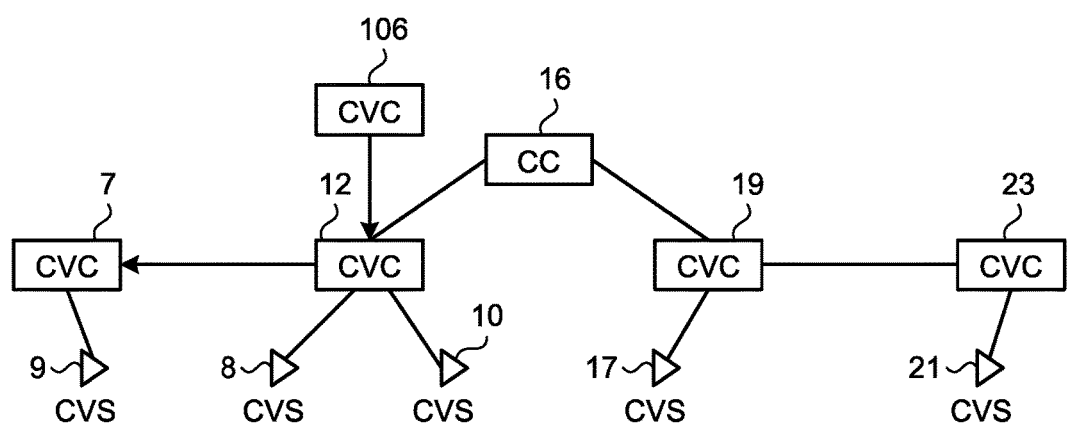
FIG. 13 is a diagram showing an example of communication among cooperative voltage control devices.

FIG. 13 is a diagram showing an example of communication among cooperative voltage control devices. FIG. 13 shows an example where the cooperative control device 106 issues upper/lower limit change request information. The cooperative voltage control device 106 generates upper/lower limit change request information and transmits the upper/lower limit change request information to the cooperative voltage control device 12. The cooperative voltage control device 12 transmits the received upper/lower limit change request information to the cooperative voltage control device 7.

Note that the cooperative voltage measurement devices, the cooperative voltage control devices, and the connection control device 16 each retain network addresses of transmission destinations of upper/lower limit change request information. Setting of the network addresses is performed such that a relay range of the upper/lower limit change request information stays in the same power distribution line. For example, the cooperative voltage measurement device 21 retains a network address of the cooperative voltage control device 23 as a transmission destination. The cooperative voltage control device 19 retains network addresses of the cooperative voltage control device 23 and the connection control device 16 as transmission destinations. Note that, when the cooperative voltage control device 19 itself issues upper/lower limit change request information and when the cooperative voltage control device 19 receives upper/lower limit change request information from the cooperative voltage measurement device 17, the cooperative voltage control device 19 sets the network addresses of the cooperative voltage control device 23 and the connection control device 16 as the transmission destinations and sends the upper/lower limit change request information to the network addresses. When the cooperative voltage control device 19 receives upper/lower limit change request information from the cooperative voltage control device 23 or the connection control device 16, the cooperative voltage control device 19 sets the network address of the other of the cooperative voltage control device 23 and the connection control device 16 that is other than a transmission source and sends the upper/lower limit change request information to the network address.

Note that, as shown in FIG. 12, the logical network is configured on the basis of the electric connection, that is, concerning one power distribution line in which up and down of a voltage is directly linked. However, when the electric connection is likely to be changed by an open/closed state change of the switch or the breaker, the connection control device 16 is set to reflect the electric connection change on the relay range of upper/lower limit change request information. When the switch or the breaker is closed, the connection control device 16 relays the upper/lower limit change request information. When the switch or the breaker is opened, the connection control device 16 discards the upper/lower limit change request information.

As explained above, in this embodiment, the cooperative voltage measurement device and the cooperative voltage control device determines, on the basis of a measured voltage and a predicted value of a voltage, that is, a fluctuation width of the voltage corresponding to a predicted value of a fluctuation width of active power, whether upper/lower limit change request information is issued. Therefore, occurrence of deviation from a proper range of a voltage of the power distribution system is suppressed during a sudden change of the voltage of the power distribution system.

Not that, in this embodiment, the cooperative voltage measurement device and the cooperative voltage control device at the request source transmits voltage sensitivity of the cooperative voltage measurement device and the cooperative voltage control device in upper/lower limit change request information. However, the voltage sensitivity can be decided separately from the upper/lower limit change request information, and the cooperative voltage control device can retain voltage sensitivities of the devices in advance. The cooperative voltage measurement device and the cooperative voltage control device at the request source can acquire voltage sensitivity of the cooperative voltage control device at the request destination, convert voltage tolerance into voltage tolerance of the request destination, and store the voltage tolerance after the conversion in the upper/lower limit change request information.

The configuration explained in the embodiment indicates an example of the content of the present invention. The configuration can be combined with another publicly-known technology or a part of the configuration can be omitted or changed without departing from the gist of the present invention.

REFERENCE SIGNS LIST 1 transformer for power distribution
2, 32 to 34 power distribution line
3, 101 breaker
4, 14 transformer
5 load
15 switch
29 bus
30 communication network
31 network cable
7, 12, 19, 23, 106 CVC
8, 9, 10, 17, 21 CVS
11, 18, 105 PCS
16 CC
40 measuring unit
41, 61 communication processing unit
42, 60 monitoring unit
43, 62 arithmetic processing unit
44, 64 storing unit
63 reactive-power-output command unit
431, 621 fluctuation calculating unit
432, 622 conversion-coefficient calculating unit
433, 623 upper/lower-limit-change-request-information generating unit
624 upper/lower-limit-change processing unit
625 deviation determining unit

The invention claimed is:

1. A voltage control device that controls a voltage control apparatus such that a voltage is maintained within a range of a proper voltage upper limit value and a proper voltage lower limit value in a power-distribution-system voltage control system including a plurality of the voltage control apparatuses that are connected to a power distribution line of a high-voltage system and control a voltage of the power distribution line,
the voltage control device comprising:
a fluctuation calculator to calculate, using a voltage and active power measured by the voltage control apparatus, voltage tolerance, which is a difference between the voltage measured by the voltage control apparatus and a proper voltage upper limit value or a proper voltage lower limit value, and voltage sensitivity, which is a ratio of a fluctuation amount of the active power and a fluctuation amount of the voltage;
an upper/lower-limit-change-request-information generator to generate upper/lower limit change request information for requesting a change of an upper limit value or a lower limit value of a control target range of another voltage control device;
an upper/lower-limit-change processor to perform a change of an upper limit value or a lower limit value of a control target range of the voltage control device according to content of the upper/lower limit change request information when the upper/lower limit change request information is received from an outside of the voltage control device; and
a communication processor to receive the upper/lower limit change request information from the outside of the voltage control device, and transmit the upper/lower limit change request information to a voltage control device other than the voltage control device, wherein
the upper/lower limit change request information includes information indicating the voltage tolerance and the voltage sensitivity.

2. The voltage control device according to claim 1, wherein the upper/lower-limit-change processor performs the change of the upper limit value or the lower limit value of the control target range of the voltage control device on the basis of the voltage tolerance and the voltage sensitivity included in the upper/lower limit change request information when the upper/lower limit change request information is received from the outside of the voltage control device.

3. The voltage control device according to claim 1, wherein
the fluctuation calculator calculates, using the voltage and the active power measured by the voltage control apparatus, a first predicted value, which is a predicted value of a maximum fluctuation amount on a positive side of the voltage per unit time, and a second predicted value, which is a predicted value of a maximum fluctuation amount on a negative side of the voltage per unit time, and
the upper/lower-limit-change-request-information generator generates the upper/lower limit change request information when a value obtained by adding the first predicted value to the voltage measured by the voltage control apparatus is larger than the proper voltage upper limit value or when a value obtained by subtracting the second predicted value from the voltage measured by the voltage control apparatus is smaller than the proper voltage lower limit value.

4. The voltage control device according to claim 3, further comprising a conversion-coefficient calculator to calculate, using the voltage and the active power measured by the voltage control apparatus, a conversion coefficient for converting a fluctuation amount of the active power per unit time into a fluctuation amount of the voltage per unit time, wherein
the fluctuation calculator calculates, using the active power measured by the voltage control apparatus, a first maximum value, which is a maximum value in a fixed period of a fluctuation amount on a positive side of the active power per unit time, and a second maximum value, which is a maximum value in a fixed period of a fluctuation amount on a negative side of the active power per unit time, calculates, as the first predicted value, a value obtained by multiplexing the first maximum value with the conversion coefficient, and calculates, as the second predicted value, a value obtained by multiplying the second maximum value with the conversion coefficient.

5. The voltage control device according to claim 4, wherein the fluctuation calculator calculates the first maximum value and the second maximum value on the basis of a value obtained by smoothing, with a first-order lag filter, the active power measured by the voltage control apparatus, a moving average, or a section average.

6. The voltage control device according to claim 4, wherein
when the voltage control apparatus controls a voltage control apparatus that converts regenerative power generated during deceleration of a train into alternating-current power and supplies the alternating-current power to the power distribution line, the fixed period is set as a first period, and when the voltage control apparatus controls a power conditioner, which is a voltage control apparatus connected to a solar battery, the fixed period is set to a second period that is shorter than the first period.

7. A voltage measurement device connected to a power distribution line of a high-voltage system in a power-distribution-system voltage control system including a voltage control apparatus that is connected to the power distribution line and controls a voltage of the power distribution line, and a voltage control device that controls the voltage control apparatus such that a voltage is maintained within a range of a proper voltage upper limit value and a proper voltage lower limit value, the voltage measurement device comprising:
a measuring device to measure a voltage and active power of the power distribution line;
a fluctuation calculator to calculate, using the voltage and the active power measured by the measuring device, voltage tolerance, which is a difference between the voltage measured by the voltage control apparatus and a proper voltage upper limit value or a proper voltage lower limit value, and voltage sensitivity, which is a ratio of a fluctuation amount of the active power and a fluctuation amount of the voltage;
an upper/lower-limit-change-request-information generator to generate upper/lower limit change request information for requesting a change of an upper limit value or a lower limit value of a control target range of the voltage control device; and
a communication processor to transmit the upper/lower limit change request information to the voltage control device, wherein
the upper/lower limit change request information includes information indicating the voltage tolerance and the voltage sensitivity.

* * * * *